(12) United States Patent
Kanda et al.

(10) Patent No.: US 11,800,245 B2
(45) Date of Patent: Oct. 24, 2023

(54) IMAGE PICKUP APPARATUS CAPABLE OF KEEPING FOCUS ON SUBJECT EVEN WHEN MOVING DIRECTION OF SUBJECT CHANGES IN TIME SERIES, CONTROL METHOD FOR IMAGE PICKUP APPARATUS, AND STORAGE MEDIUM

(71) Applicant: CANON KABUSHIKI KAISHA, Tokyo (JP)

(72) Inventors: Akihiko Kanda, Kanagawa (JP); Hideyuki Hamano, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/678,444

(22) Filed: Feb. 23, 2022

(65) Prior Publication Data

US 2022/0272271 A1 Aug. 25, 2022

(30) Foreign Application Priority Data

Feb. 25, 2021 (JP) .................................. 2021-028816

(51) Int. Cl.
 *H04N 23/959* (2023.01)
 *G06T 7/20* (2017.01)
 *H04N 23/67* (2023.01)

(52) U.S. Cl.
 CPC ............. *H04N 23/959* (2023.01); *G06T 7/20* (2013.01); *H04N 23/675* (2023.01)

(58) Field of Classification Search
 CPC ........ H04N 5/232125; H04N 5/232127; G06T 7/20; G06T 2207/20081; G06T 2207/20084; G06T 2207/30196
 See application file for complete search history.

(56) References Cited

FOREIGN PATENT DOCUMENTS

JP 2015-191074 A 11/2015

OTHER PUBLICATIONS

Translation of JP 2015191074 (Year: 2015).*

* cited by examiner

*Primary Examiner* — Twyler L Haskins
*Assistant Examiner* — Angel L Garces-Rivera
(74) *Attorney, Agent, or Firm* — Cowan, Liebowitz & Latman, P.C.

(57) ABSTRACT

An image pickup apparatus capable of keeping a focus on a subject even when a moving direction of the subject changes in time series is provided. The image pickup apparatus comprising at least one processor and/or circuit configured to function as following units, an image pickup unit configured to pick up a subject image formed by an image pickup optical system and generate image data, a subject detecting unit configured to detect a subject included in the image data generated by the image pickup unit and obtain a subject detection result, a focus detection unit configured to obtain a focus detection result of a focus detection area, which is set based on the subject detection result, and a control unit configured to perform a predictive calculation, which predicts a position of the subject detected by the subject detecting unit at a time after a predetermined period of time has elapsed from a focus detection time, and perform focus control of the image pickup optical system. The control unit changes at least one of a subject position prediction condition and a focus control condition according to time-series changes in the subject detection result obtained by the subject detecting unit and the focus detection result obtained by the focus detection unit.

11 Claims, 26 Drawing Sheets

PLAN VIEW a-a LINE SECTIONAL VIEW

FIG. 15

| SUBJECT TYPE | PHOTOGRAPHING SCENE | IMPORTANT ORGAN | FOCUS AREA |
|---|---|---|---|
| PERSON | FACE ZOOM-UP (RIGHT) | RIGHT EYE | EYELASHES OF RIGHT EYE |
|  | FACE (RIGHT) | RIGHT EYE | RIGHT EYE |
| MOTORCYCLE | FRONT | HELMET | HELMET |
|  | SIDEWAYS (TILT TOWARD BACK SIDE) | HELMET | BODY |
|  | SIDEWAYS (TILT TOWARD FRONT SIDE) | HELMET | HELMET |
| CAR | FRONT (FROM ABOVE) | HELMET | AREA TO FIT BODY WITHIN DEPTH |
|  | SIDEWAYS | HELMET | BODY |

*FIG. 20*

| THE NUMBER OF HISTORY DATA USED IN PREDICTIVE CALCULATION |
|---|
| FOCUS MOVABLE RANGE |
| FOCUS MOVING SPEED |
| FOCUS DETECTION AREA |

IMAGE PICKUP APPARATUS CAPABLE OF KEEPING FOCUS ON SUBJECT EVEN WHEN MOVING DIRECTION OF SUBJECT CHANGES IN TIME SERIES, CONTROL METHOD FOR IMAGE PICKUP APPARATUS, AND STORAGE MEDIUM

BACKGROUND OF THE INVENTION

Field of the Invention

The present invention relates to an image pickup apparatus, a control method for the image pickup apparatus, and a storage medium.

Description of the Related Art

In continuous photographing that continuously performs a plurality of photographing, in the case of photographing a moving subject (hereinafter, also referred to as "a moving object") that is detected by an image pickup apparatus, it is necessary to track the moving subject by keeping a focus on the moving subject. As a related technique, a technique disclosed in Japanese Laid-Open Patent Publication (kokai) No. 2015-191074 has been proposed. In the technique disclosed in Japanese Laid-Open Patent Publication (kokai) No. 2015-191074, in order to track a subject, an orientation of the subject, and age and/or type of the subject are detected, and a moving position of the subject during focus control is predicted according to a moving speed corresponding to the detected age of the subject and/or the detected type of the subject, and the detected orientation of the subject.

In the technique disclosed in Japanese Laid-Open Patent Publication (kokai) No. 2015-191074, since the moving position of the subject during the focus control is predicted according to the orientation of the subject and the moving speed corresponding to the age and/or the type of the subject, when a moving direction (a traveling direction) of the detected subject changes in time series, there is a risk of making a mistake in a predictive position of the subject, or there is a risk that the focus moves carelessly.

SUMMARY OF THE INVENTION

The present invention provides an image pickup apparatus capable of keeping a focus on a subject even when a moving direction of the subject changes in time series, a control method for the image pickup apparatus, and a storage medium.

Accordingly, the present invention provides an image pickup apparatus comprising at least one processor and/or circuit configured to function as following units, an image pickup unit configured to pick up a subject image formed by an image pickup optical system and generate image data, a subject detecting unit configured to detect a subject included in the image data generated by the image pickup unit and obtain a subject detection result, a focus detection unit configured to obtain a focus detection result of a focus detection area, which is set based on the subject detection result, and a control unit configured to perform a predictive calculation, which predicts a position of the subject detected by the subject detecting unit at a time after a predetermined period of time has elapsed from a focus detection time, and perform focus control of the image pickup optical system, and wherein the control unit changes at least one of a subject position prediction condition and a focus control condition according to time-series changes in the subject detection result obtained by the subject detecting unit and the focus detection result obtained by the focus detection unit.

According to the present invention, it is possible to keep the focus on the subject even when the moving direction of the subject changes in time series.

Further features of the present invention will become apparent from the following description of exemplary embodiments with reference to the attached drawings.

BRIEF DESCRIPTION OF THE DRAWINGS

FIG. 15 is a diagram that shows examples of scenes, in which detection as the focus area in the first embodiment can be effective.

FIG. 20 is a diagram for explaining items to be changed at the time of predictive calculation and at the time of focus control in the first embodiment.

DESCRIPTION OF THE EMBODIMENTS

The present invention will now be described in detail below with reference to the accompanying drawings showing embodiments thereof.

Figure 1:
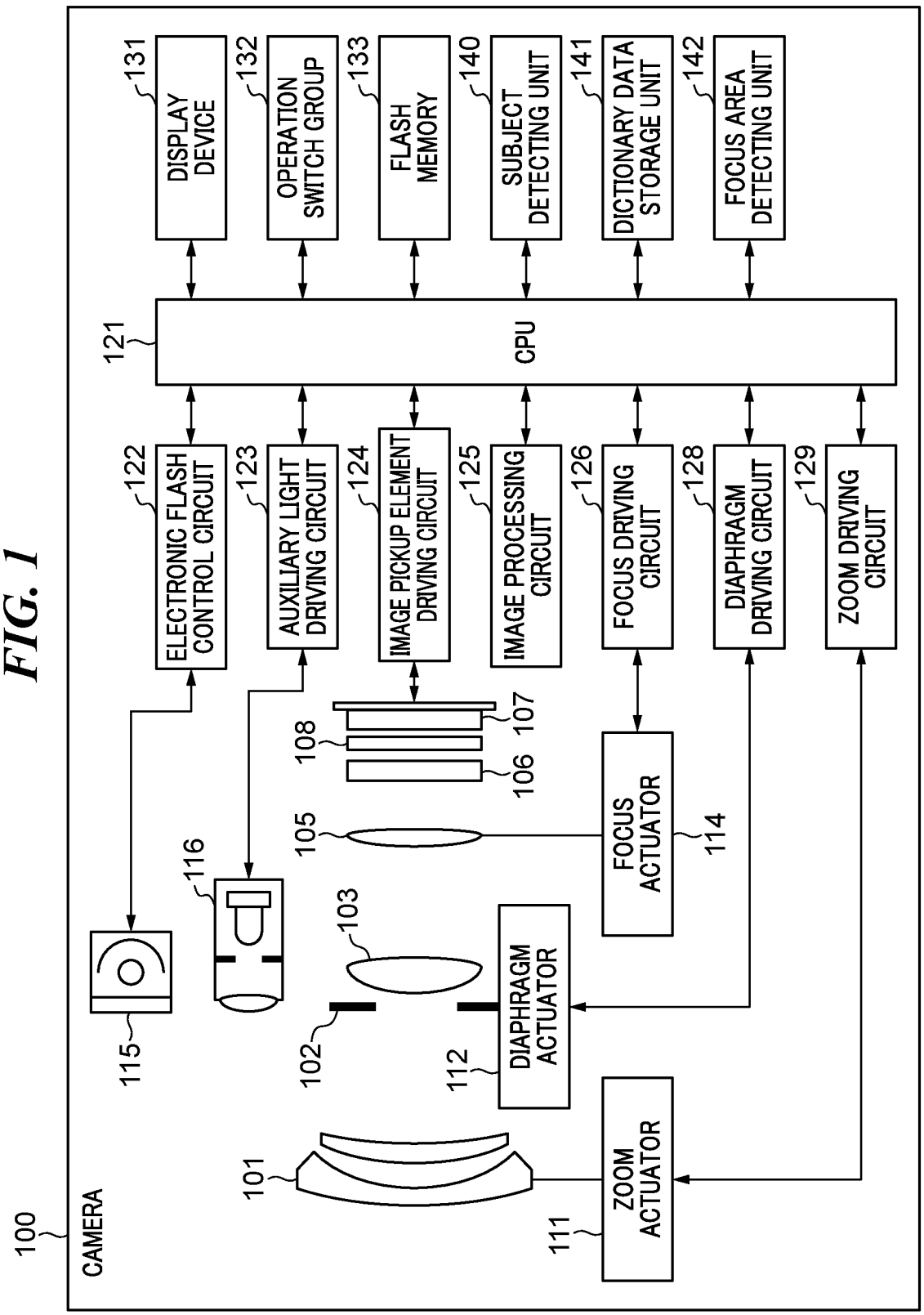
FIG. 1 is a block diagram that shows a configuration example of an image pickup apparatus according to a first embodiment of the present invention.

Hereinafter, a first embodiment of the present invention will be described with reference to the drawings. FIG. 1 is a block diagram that shows a configuration example of an image pickup apparatus (a camera 100) according to the first embodiment of the present invention.

As shown in FIG. 1, the camera 100 includes an image pickup optical system, a zoom actuator 111, a diaphragm actuator 112, a focus actuator 114, an electronic flash 115, an AF (autofocus) auxiliary light emitting unit 116, an image pickup element 107, and a shutter 108. Further, the camera 100 includes a CPU (Central Processing Unit) 121, an electronic flash control circuit 122, an auxiliary light driving circuit 123, an image pickup element driving circuit 124, an image processing circuit 125, a focus driving circuit 126, a diaphragm driving circuit 128, and a zoom driving circuit 129. Furthermore, the camera 100 has a display device 131, an operation switch group 132, a flash memory 133, a subject detecting unit 140, a dictionary data storage unit 141, and a focus area detecting unit 142.

The image pickup optical system is configured by a first lens group 101, a diaphragm 102, a second lens group 103, a third lens group 105, and an optical low-pass filter 106. The first lens group 101 is disposed on the most subject side (front side) of the image pickup optical system as an image forming optical system, and is held so as to be movable in an optical axis direction. The diaphragm 102 performs a light amount adjustment by adjusting an aperture diameter thereof. The second lens group 103 moves in the optical axis direction integrally with the diaphragm 102, and performs scaling (zoom) together with the first lens group 101 moving in the optical axis direction. The third lens group (a focus lens) 105 moves in the optical axis direction to perform a focus adjustment. The optical low-pass filter 106 is an optical element for reducing false colors and moire of picked-up images.

The zoom actuator 111 rotates a cam cylinder (not shown) around an optical axis to move the first lens group 101 and the second lens group 103 in the optical axis direction by means of a cam provided on the cam cylinder so as to perform the scaling. Further, the diaphragm actuator 112 drives a plurality of light shielding blades (not shown) in an opening/closing direction for a light amount adjusting operation of the diaphragm 102. Furthermore, the focus actuator 114 moves the third lens group 105 in the optical axis direction to perform the focus adjustment.

The focus driving circuit 126 drives the focus actuator 114 in response to a focus driving command from the CPU 121 to move the third lens group 105 in the optical axis direction. The diaphragm driving circuit 128 drives the diaphragm actuator 112 in response to a diaphragm driving command from the CPU 121. The zoom driving circuit 129 drives the zoom actuator 111 according to a zoom operation of a user.

In the first embodiment, a case that the image pickup optical system, the zoom actuator 111, the diaphragm actuator 112, the focus actuator 114, the focus driving circuit 126, the diaphragm driving circuit 128, and the zoom driving circuit 129 are provided integrally with a camera main body (not shown) of the camera 100 will be described. Further, the camera main body includes the image pickup element 107. Moreover, an interchangeable lens, which has the image pickup optical system, the zoom actuator 111, the diaphragm actuator 112, the focus actuator 114, the focus driving circuit 126, the diaphragm driving circuit 128, and the zoom driving circuit 129, may be attached to and detached from the camera main body.

The electronic flash 115 has a light emitting element such as a xenon tube or an LED (Light Emitting Diode), and emits light that illuminates a subject. The AF auxiliary light emitting unit 116 has a light emitting element such as an LED, and improves a focus detection performance with respect to a dark or low-contrast subject by projecting an image of a mask having a predetermined aperture pattern onto the subject through a light projecting lens. Further, the electronic flash control circuit 122 controls the electronic flash 115 so as to be turned on in synchronization with an image pickup operation. Furthermore, the auxiliary light driving circuit 123 controls the AF auxiliary light emitting unit 116 so as to be turned on in synchronization with a focus detection operation.

The CPU 121 performs various kinds of controls in the camera 100. The CPU 121 includes a calculation unit, a ROM (Read Only Memory), a RAM (Random Access Memory), an A/D (Analog to Digital) converter, a D/A (Digital to Analog) converter, a communication interface circuit, etc. The CPU 121 drives various kinds of circuits within the camera 100, and controls a series of processes (operations) such as an AF processing, an image pickup processing, an image processing, and recording by executing computer programs stored in the ROM. The CPU 121 functions as an image processing apparatus. The image processing apparatus may be configured to include the subject detecting unit 140, the dictionary data storage unit 141, the focus area detecting unit 142, etc., in addition to the CPU 121.

The image pickup element 107 is configured by a two-dimensional CMOS (Complementary Metal Oxide Semiconductor) photosensor including a plurality of pixels and its peripheral circuit, and is disposed on an image forming plane of the image pickup optical system. The image pickup element 107 photoelectrically converts a subject image, which is formed by the image pickup optical system. The image pickup element driving circuit 124 controls the operation of the image pickup element 107, and transmits digital signals, which are obtained by performing an A/D conversion with respect to analog signals generated by a photoelectric conversion, to the CPU 121.

The shutter 108 has a configuration of a focal plane shutter, and performs driving of the focal plane shutter in response to a command from a shutter driving circuit built in the shutter 108 and based on an instruction from the CPU 121. While signals of the image pickup element 107 are being read out, the image pickup element 107 is shielded from light. Further, when exposure is being performed, the focal plane shutter is opened, and a photographing light flux is guided to the image pickup element 107.

The image processing circuit (an image processing unit) 125 applies predetermined image processes to image data stored in the RAM within the CPU 121. The image processes applied by the image processing circuit 125 include socalled development processes such as a white balance adjustment processing, a color interpolation processing (a demosaic processing), and a gamma correction processing, as well as a signal format conversion processing and scaling processing, but are not limited to these.

Further, the image processing circuit 125 determines a main subject based on posture information of the subject and position information of an object, which is unique to a scene (hereinafter, referred to as "a unique object"). The result of this determination processing performed by the image processing circuit 125 may be used in other image processes (for example, the white balance adjustment processing). The image processing circuit 125 stores the processed image data, a joint position of each subject, position and size information of the unique object, the center of gravity of the subject determined to be the main subject, position information of a face and pupils, etc., in the RAM within the CPU 121.

The display device (a display unit) 131 has a display element such as an LCD (Liquid Crystal Display), and displays information about an image pickup mode of the camera 100, a preview image before image pickup, a confirmation image after image pickup, an index of a focus detection area, an in-focus image, and the like. The operation switch group 132 includes a main switch (a power switch), a release switch (a photographing trigger switch), a zoom operation switch, a photographing mode selection switch, etc., and is operated by the user. The flash memory 133 records the picked-up images. Moreover, the flash memory 133 can be attached to and detached from the camera 100.

The subject detecting unit 140 performs a subject detecting processing based on dictionary data for subject detection, which is generated by machine learning. In the first embodiment, in order to detect a plurality of types of subjects, the subject detecting unit 140 uses the dictionary data for subject detection of each subject. Each dictionary data for subject detection is, for example, data, in which characteristics of the corresponding subject are registered. The subject detecting unit 140 performs subject detection while sequentially switching the dictionary data for subject detection of each subject. In the first embodiment, the dictionary data for subject detection of each subject is stored in the dictionary data storage unit 141. Therefore, a plurality of the dictionary data for subject detection are stored in the dictionary data storage unit 141. The CPU 121 determines which of the dictionary data for subject detection from the plurality of the dictionary data for subject detection is used in performing the subject detection based on preset subject priorities and settings of the camera 100 (the image pickup apparatus).

The focus area detecting unit 142 performs detecting of an area within the subject that should be focused (an area within the subject that should be brought into focus) based on dictionary data for focus area detection, which is generated by the machine learning. In the first embodiment, the focus area detecting unit 142 sets at least image signals of an area (hereinafter, referred to as "a subject detection area") of a subject (hereinafter, referred to as "a detected subject") detected by the subject detecting unit 140 as inputs, and obtains a focus area as an output. The focus area is the area within the detected subject that should be focused. In the first embodiment, the dictionary data for focus area detection of each subject is stored in the dictionary data storage unit 141. Therefore, a plurality of the dictionary data for focus area detection are stored in the dictionary data storage unit 141. The dictionary data for focus area detection, which is used in the focus area detecting unit 142 and is associated with the dictionary data for subject detection used in the subject detecting unit 140, is selected and used. Details will be described later.

The dictionary data storage unit 141, which functions as a storage unit, stores the dictionary data for subject detection of each subject and the dictionary data for focus area detection of each subject. The subject detecting unit 140 estimates a position of the subject in the image based on image data picked up by the camera 100 that functions as an image pickup unit (hereinafter, referred to as "picked-up image data") and the dictionary data for subject detection. Further, the subject detecting unit 140 may estimate information such as a position, a size, and a reliability of the subject, and output the estimated information. Furthermore, the subject detecting unit 140 may output other information. Similarly, as described above, the focus area detecting unit 142 sets the image data of the subject detection area as an input image, and outputs an area within the input image that should be focused (the focus area) based on the dictionary data for focus area detection.

The dictionary data for subject detection, which is used by the subject detecting unit 140, includes, for example, person dictionary data for detecting "person" as the subject, animal dictionary data for detecting "animal" as the subject, vehicle dictionary data for detecting "vehicle" as the subject, etc. Further, dictionary data for detecting "the whole person" and dictionary data for detecting "face of person" may be separately stored in the dictionary data storage unit 141.

For example, in the case that "a vehicle" is detected as the subject and used as the input image, the dictionary data for focus area detection is dictionary data that outputs an area of a head of a driver of the vehicle or an area of a side face of a casing of the vehicle according to the size of the subject and photographing settings. The focus area detecting unit 142 uses the dictionary data for focus area detection. In the present invention, in this way, by outputting the area that should be focused (the focus area) separately from the subject detection area, it is possible to obtain an image, which is in focus in an appropriate area according to the photographing scene. Details will be described later.

In the first embodiment, the subject detecting unit 140 is configured by a machine-learned (deep-learned) CNN (convolutional neural network), and estimates the position, etc. of the subject included in the picked-up image data. Further, the focus area detecting unit 142 is configured by a machine-learned (deep-learned) CNN (hereinafter, referred to as "a learned CNN"), and estimates a position that should be focused, etc., in the area within the detected subject. In the first embodiment, the subject detecting unit 140 and the focus area detecting unit 142 are configured by the machine-learned CNNs that are realized by different machine learning approaches, respectively. Moreover, the subject detecting unit 140 and the focus area detecting unit 142 may be realized by a GPU (graphics processing unit) or a circuit specialized for an estimation processing by a CNN.

In the present invention, the machine learning of the CNN can be performed by any method. For example, such a method, in which a predetermined computer such as a server performs the machine learning of the CNN to generate the learned CNN (that is, a learned model) and the camera 100 obtains the learned CNN from the predetermined computer, may be used. Concretely, for example, the predetermined computer may perform the machine learning of the CNN of the subject detecting unit 140 by performing supervised learning, which uses image data for learning as input and uses the position of the subject, etc. corresponding to the image data for learning as teacher data (training data). Further, the predetermined computer may perform the machine learning of the CNN of the focus area detecting unit 142 by performing supervised learning, which uses the image data for learning as input and uses the position that should be focused, etc., corresponding to the subject of the image data for learning as teacher data (training data). In this way, the learned CNN (the learned model) of the subject detecting unit 140 and the learned CNN (the learned model) of the focus area detecting unit 142 are generated.

Here, as described above, the subject detecting unit 140 detects the subject by using the dictionary data for subject detection. Further, the subject detecting unit 140 detects the subject by using the dictionary data for subject detection of different types of subjects (persons, animals, vehicles, etc.). In the first embodiment, each dictionary data for subject detection used by the subject detecting unit 140 is generated by applying the learned CNN, which constitutes the subject detecting unit 140. Further, the focus area detecting unit 142 detects the focus area by using the dictionary data for focus area detection. Each dictionary data for focus area detection used by the focus area detecting unit 142 is also generated by applying the learned CNN, which constitutes the focus area detecting unit 142.

Further, the machine learning of the CNN may be performed by the camera 100 (the image pickup apparatus) or the CPU 121 (the image processing apparatus).

Moreover, as described above, in the first embodiment, the subject detecting unit 140 and the focus area detecting unit 142 are configured by different machine-learned CNNs that are realized by different machine learning approaches, respectively. However, the present invention is not limited to this, and the subject detecting unit 140 and the focus area detecting unit 142 may be configured by different machine-learned neural networks. Further, the subject detecting unit 140 and the focus area detecting unit 142 may be configured by learned models other than the learned CNNs. For example, the subject detecting unit 140 and the focus area detecting unit 142 may be configured by learned models that are machine-learned by an arbitrary machine learning algorithm such as a support vector machine or logistics regression.

Figure 2:
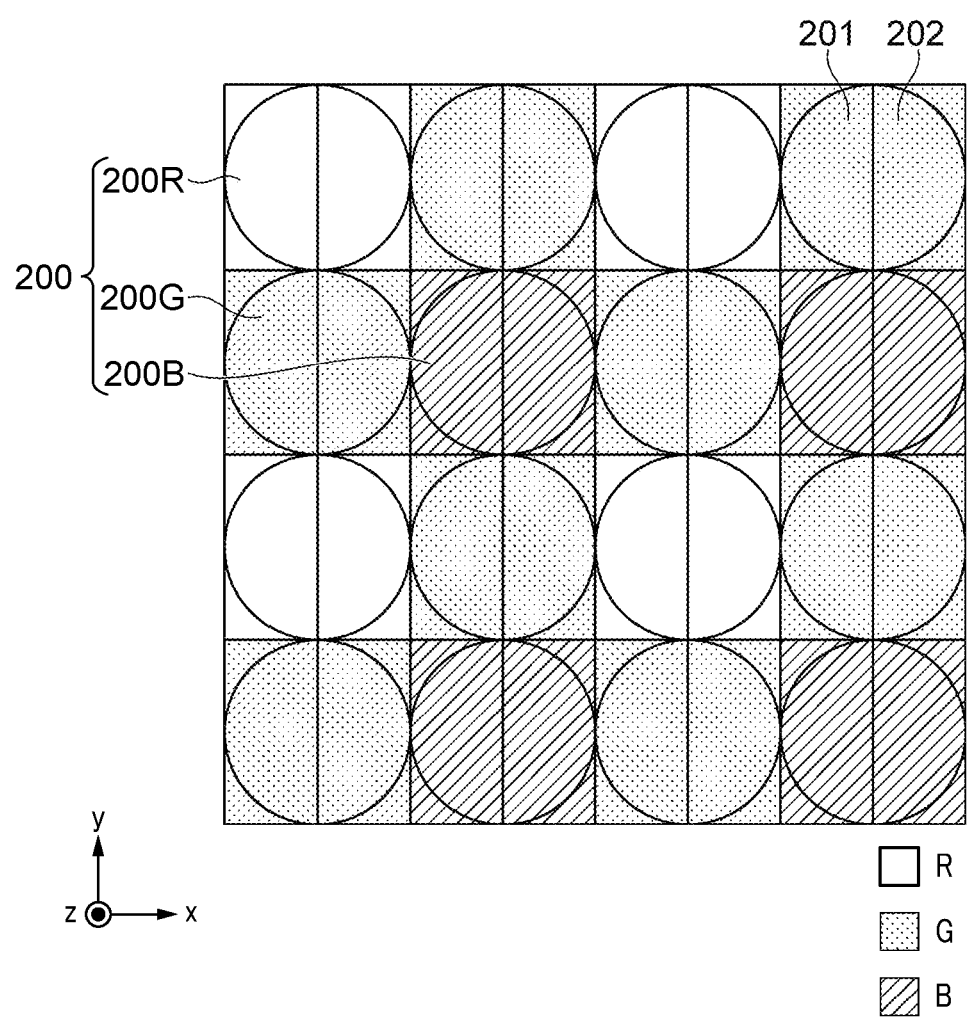
FIG. 2 is a diagram that shows a pixel array of an image pickup element in the image pickup apparatus according to the first embodiment.

Next, with reference to FIG. 2, a pixel array of the image pickup element 107 in the image pickup apparatus (the camera 100) according to the first embodiment will be described. FIG. 2 shows a pixel array in a range of 4-pixel columns×4-pixel rows within the image pickup element 107 as viewed from the optical axis direction (hereinafter, referred to as "a z direction").

As shown in FIG. 2, one pixel unit 200 includes four image pickup pixels that are arranged in 2 rows×2 columns. By arranging a large number of pixel units 200 on the image pickup element 107, it is possible to perform the photoelectric conversion of a two-dimensional subject image. In one pixel unit 200, an image pickup pixel (hereinafter, referred to as "an R pixel") 200R having an R (red) spectral sensitivity is arranged on the upper left, and an image pickup pixel (hereinafter, referred to as "a G pixel") 200G having a G (green) spectral sensitivity is arranged on the upper right and the lower left, respectively. Further, an image pickup pixel (hereinafter, referred to as "a B pixel") 200B having a B (blue) spectral sensitivity is arranged on the lower right. Further, each image pickup pixel includes a first focus detection pixel 201 and a second focus detection pixel 202 that are divided in a horizontal direction (hereinafter, referred to as "an x direction").

In the image pickup element 107 of the camera 100 according to the first embodiment, a pixel pitch P of the image pickup pixels is 4 μm, and the number of image pickup pixels N is about 20.75 million pixels (5575 columns in the x direction×3725 rows in a vertical direction (hereinafter, referred to as "a y direction")). Further, a pixel pitch PAF of the focus detection pixels is 2 μm, and the number of focus detection pixels NAF is about 41.5 million pixels (11150 columns in the x direction×3725 rows in the y direction).

In the first embodiment, the case that each image pickup pixel is divided into two in the horizontal direction will be described, but each image pickup pixel may be divided in the vertical direction. Further, the image pickup element 107 of the first embodiment has a plurality of image pickup pixels including the first focus detection pixel 201 and the second focus detection pixel 202, respectively, but the image pickup pixel, the first focus detection pixel, and the second focus detection pixel may be provided as separate pixels. For example, the first focus detection pixel and the second focus detection pixel may be arranged discretely in the plurality of image pickup pixels.

Figure 3A:
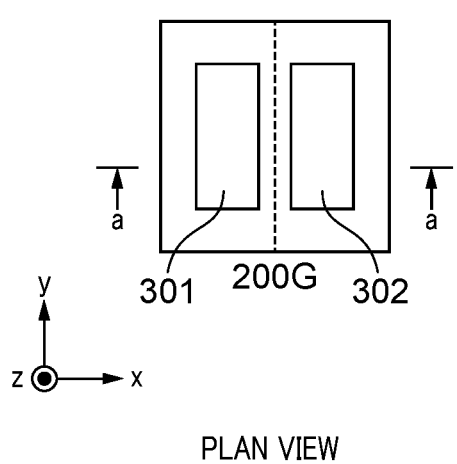
FIG. 3A is a plan view of an image pickup pixel in the image pickup element of the first embodiment.

FIG. 3A shows one image pickup pixel (in FIG. 3A, the G pixel 200G) as viewed from the light receiving surface side (+z direction) of the image pickup element 107 of the first embodiment. Further, FIG. 3B shows a a-a cross section of the image pickup pixel of FIG. 3A as viewed from −y direction.

Figure 3B:
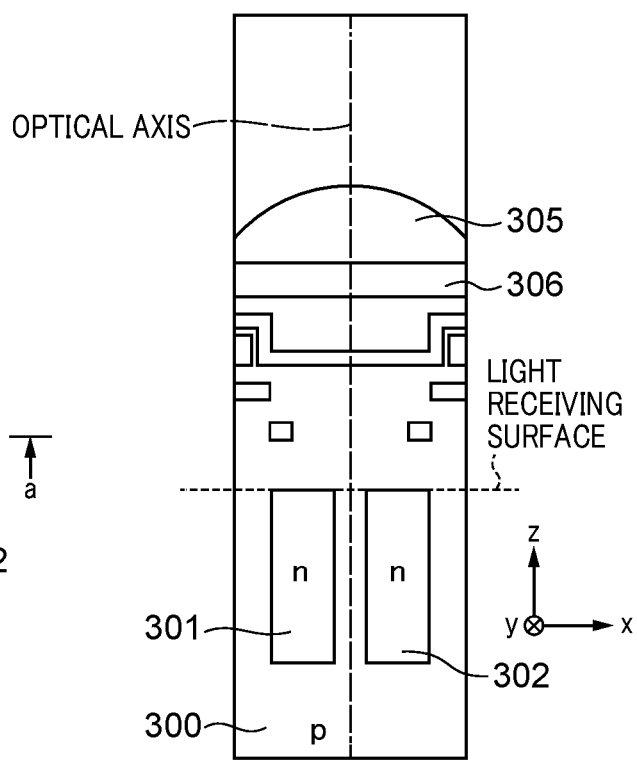
FIG. 3B is a cross sectional view of the image pickup pixel in the image pickup element of the first embodiment.

As shown in FIG. 3B, one image pickup pixel is provided with one microlens 305 for condensing incident light. Further, the image pickup pixel is provided with a photoelectric conversion unit 301 and a photoelectric conversion unit 302 that are divided into N (in the first embodiment, divided into two) in the x direction. The photoelectric conversion unit 301 and the photoelectric conversion unit 302 correspond to the first focus detection pixel 201 and the second focus detection pixel 202, respectively. The centers of gravity of the photoelectric conversion unit 301 and the photoelectric conversion unit 302 are eccentric to −x direction side and +x direction side with respect to an optical axis of the microlens 305, respectively.

An R, G, or B color filter 306 is provided between the microlens 305, and the photoelectric conversion unit 301 and the photoelectric conversion unit 302 in each image pickup pixel. Moreover, a spectral transmittance of the color filter may be changed for each photoelectric conversion unit, or the color filter may be omitted.

The light incident on the image pickup pixel from the image pickup optical system is condensed by the microlens 305, separated by the color filter 306, received by the photoelectric conversion unit 301 and the photoelectric conversion unit 302, and then photoelectrically converted.

Figure 4:
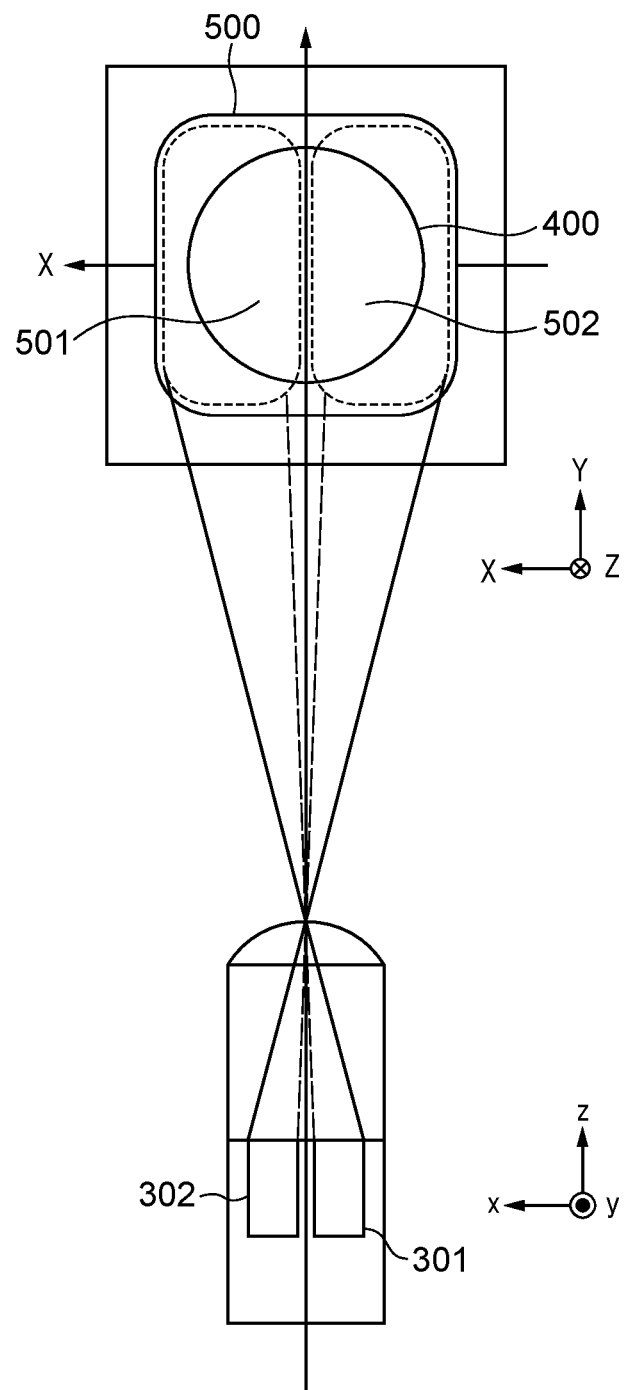
FIG. 4 is a diagram for explaining a structure of the image pickup pixel in the image pickup element of the first embodiment.

Next, with reference to FIG. 4, a relationship between a structure of the image pickup pixel shown in FIG. 3A and FIG. 3B, and pupil division will be described. FIG. 4 shows the a-a cross section of the image pickup pixel shown in FIG. 3A as viewed from +y direction, and also shows an exit pupil of the image pickup optical system. In FIG. 4, in order to correspond to coordinate axes of the exit pupil, the x direction and the y direction of the image pickup pixel are inverted with respect to FIG. 3B.

As shown in FIG. 4, in the exit pupil, a first pupil region 501 whose center of gravity is eccentric toward +X direction side is a region of the image pickup pixel that is substantially conjugate with the light receiving surface of the photoelectric conversion unit 301 on −x direction side by the microlens 305. The light flux, which has passed through the first pupil region 501, is received by the photoelectric conversion unit 301, that is, is received by the first focus detection pixel 201. Further, in the exit pupil, a second pupil region 502 whose center of gravity is eccentric toward −X direction side is a region of the image pickup pixel that is substantially conjugate with the light receiving surface of the photoelectric conversion unit 302 on +x direction side by the microlens 305. The light flux, which has passed through the second pupil region 502, is received by the photoelectric conversion unit 302, that is, is received by the second focus detection pixel 202. A pupil region 500 indicates a pupil region, in which light can be received by the entire image pickup pixel, in which the photoelectric conversion unit 301 and the photoelectric conversion unit 302 (the first focus detection pixel 201 and the second focus detection pixel 202) are all combined.

Figure 5:
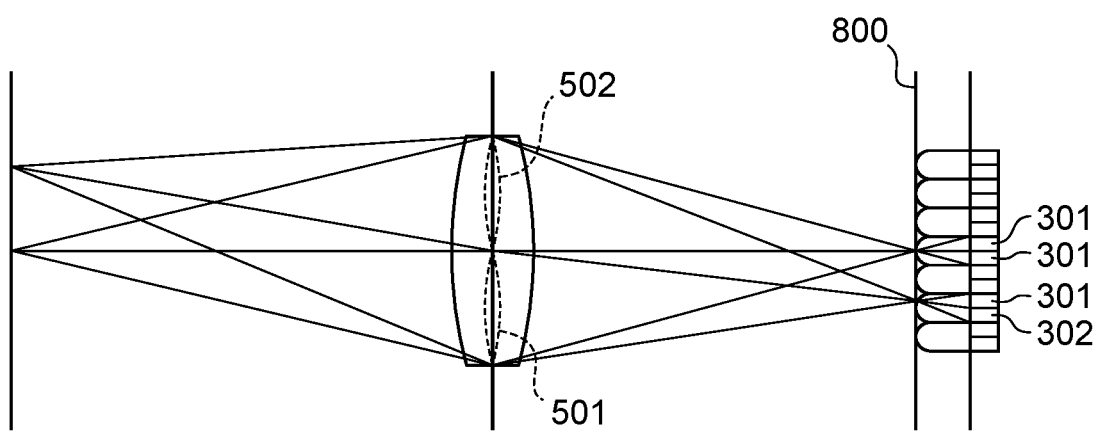
FIG. 5 is a diagram for explaining pupil division by the image pickup element of the first embodiment.

Next, with reference to FIG. 5, the pupil division by the image pickup element will be described. FIG. 5 shows pupil division by the image pickup element 107. As shown in FIG. 5, a pair of light fluxes, which have passed through the first pupil region 501 and the second pupil region 502, respectively, are incident on each image pickup pixel of the image pickup element 107 at different angles, and are received by the first focus detection pixel 201 and the second focus detection pixel 202 that are divided into two. In the first embodiment, output signals from the first focus detection pixels 201 of the plurality of image pickup pixels of the image pickup element 107 are collected to generate first focus detection signals, and output signals from the second focus detection pixels 202 of the plurality of image pickup pixels of the image pickup element 107 are collected to generate second focus detection signals. Further, the output signals from the first focus detection pixels 201 of the plurality of image pickup pixels and the output signals from the second focus detection pixels 202 of the plurality of image pickup pixels are added to generate image pickup pixel signals. Furthermore, the image pickup pixel signals from the plurality of image pickup pixels are combined to generate image pickup signals for generating an image having a resolution corresponding to the number of effective pixels N (the number of image pickup pixels N).

Figure 6:
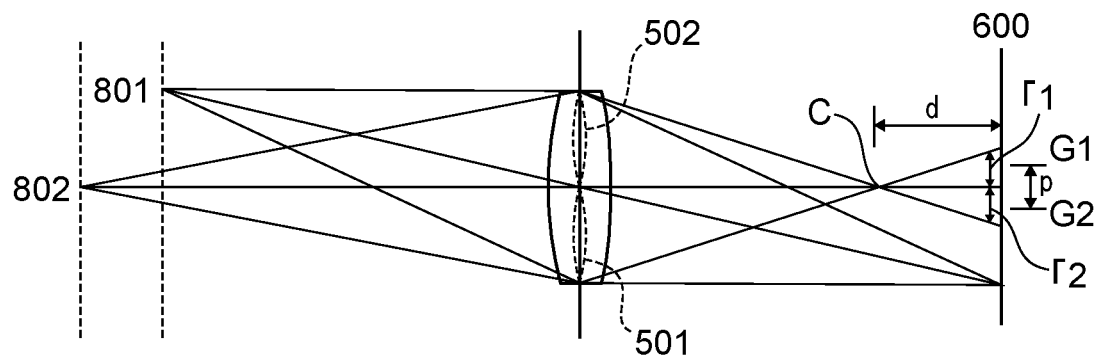
FIG. 6 is a diagram for explaining a relationship between a defocus amount and an image shift amount in the first embodiment.

Next, with reference to FIG. 6, a relationship between a defocus amount of the image pickup optical system, and a phase difference between the first focus detection signal and the second focus detection signal that are obtained from the image pickup element 107 (hereinafter, referred to as "an image shift amount") will be described. In FIG. 6, the image pickup element 107 is arranged on an image pickup plane 600, and as described with reference to FIG. 4 and FIG. 5, the exit pupil of the image pickup optical system is divided into two, i.e., the first pupil region 501 and the second pupil region 502.

As shown in FIG. 6, in the case of setting a distance (a magnitude) of light fluxes from subjects (801, 802) from an image forming position C to the image pickup plane 600 as |d|, a defocus amount d is defined so that a front focus state, in which the image forming position C is on the subject side from the image pickup plane 600, is represented by a minus sign (d<0). Further, the defocus amount d is defined so that a rear focus state, in which the image forming position C is on the side opposite to the subject from the image pickup plane 600, is represented by a plus sign (d>0). In an in-focus state, in which the image forming position C is on the image pickup plane 600, d=0. The image pickup optical system is in the in-focus state (d=0) with respect to the subject 801, and is in the front focus state (d<0) with respect to the subject 802. The front focus state (d<0) and the rear focus state (d>0) are collectively referred to as a defocus state (|d|>0).

In the front focus state (d<0), among the light fluxes from the subject 802, the light flux that has passed through the first pupil region 501 (the second pupil region 502) is once condensed, then spreads over a width Γ1 (Γ2) around a gravity center position G1 (G2) of the light flux, and forms an out-of-focus image (an out-of-focus optical image) on the image pickup plane 600. This out-of-focus image is received by each first focus detection pixel 201 (each second focus detection pixel 202) on the image pickup element 107, and the first focus detection signals (the second focus detection signals) are generated. That is, the first focus detection signals (the second focus detection signals) become signals that represent a subject image, in which the subject 802 is out of focus by the out-of-focus width Γ1 (Γ2) at the gravity center position G1 (G2) of the light flux on the image pickup plane 600.

The out-of-focus width Γ1 (Γ2) of the subject image increases substantially in proportion to an increase in the magnitude |d| of the defocus amount d of the first focus detection signal and the second focus detection signal. Similarly, a magnitude |p| of an image shift amount p of the subject image between the first focus detection signal and the second focus detection signal (=a difference G1-G2 between the gravity center positions of the light flux) also increases substantially in proportion to the increase in the magnitude |d| of the defocus amount d. Although in the rear focus state (d>0), an image shift direction of the subject image between the first focus detection signal and the second focus detection signal is opposite to that in the front focus state (d<0), the rear focus state (d>0) is the same as the front focus state (d<0).

As described above, as the magnitude of the defocus amount increases, the magnitude of the image shift amount of the subject image between the first focus detection signal and the second focus detection signal increases. In the first embodiment, "focus detection by image pickup plane phase difference detection method", which calculates the defocus amount based on the image shift amount of the subject image between the first focus detection signal and the second focus detection signal obtained by using the image pickup element 107, is performed.

Figure 7:
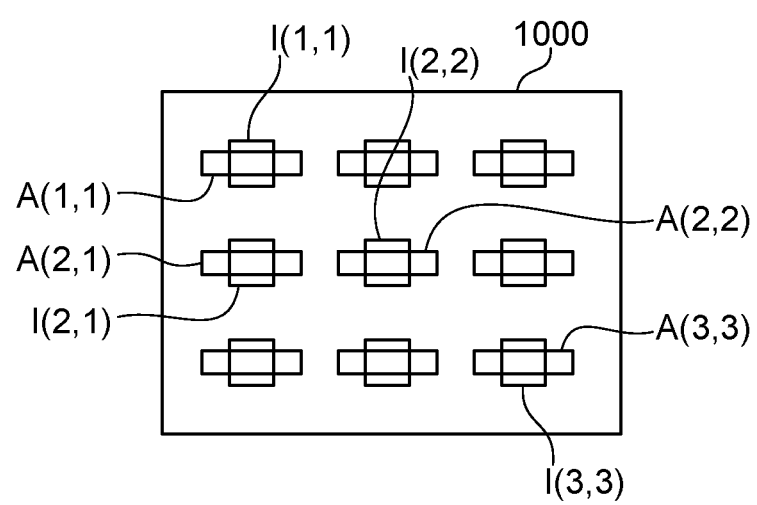
FIG. 7 is a diagram for explaining a focus detection area in the first embodiment.

Next, with reference to FIG. 7, the focus detection area for obtaining the first focus detection signal and the second focus detection signal in the image pickup element 107 will be described. In FIG. 7, A(n, m) indicates a focus detection area, which is the n-th focus detection area in the x direction and the m-th focus detection area in the y direction among a plurality of focus detection areas (in FIG. 7, three focus detection areas in the x direction, three focus detection areas in the y direction, and nine focus detection areas in total) that are set in an effective pixel area 1000 of the image pickup element 107. The first focus detection signals and the second focus detection signals are generated from the output signals from a plurality of the first focus detection pixels 201 and the second focus detection pixels 202 that are included in the focus detection area A(n, m). I(n, m) indicates an index for displaying a position of the focus detection area A(n, m) on the display device 131.

Moreover, the case of the nine focus detection areas shown in FIG. 7 is merely an example, and in the present invention, the number, position, and size of the focus detection areas are not limited to the example of FIG. 7. For example, in a predetermined range centered on a position specified by the user or a position of the subject detected by the subject detecting unit 140 (hereinafter, also referred to as "a subject position"), one or a plurality of areas may be set as the focus detection area. In the first embodiment, when obtaining a defocus map described later, the focus detection areas are arranged so that a focus detection result with a higher resolution can be obtained. For example, a total of 9600 focus detection areas are arranged on the image pickup element 107 in 120 horizontal divisions and 80 vertical divisions.

Figure 8:
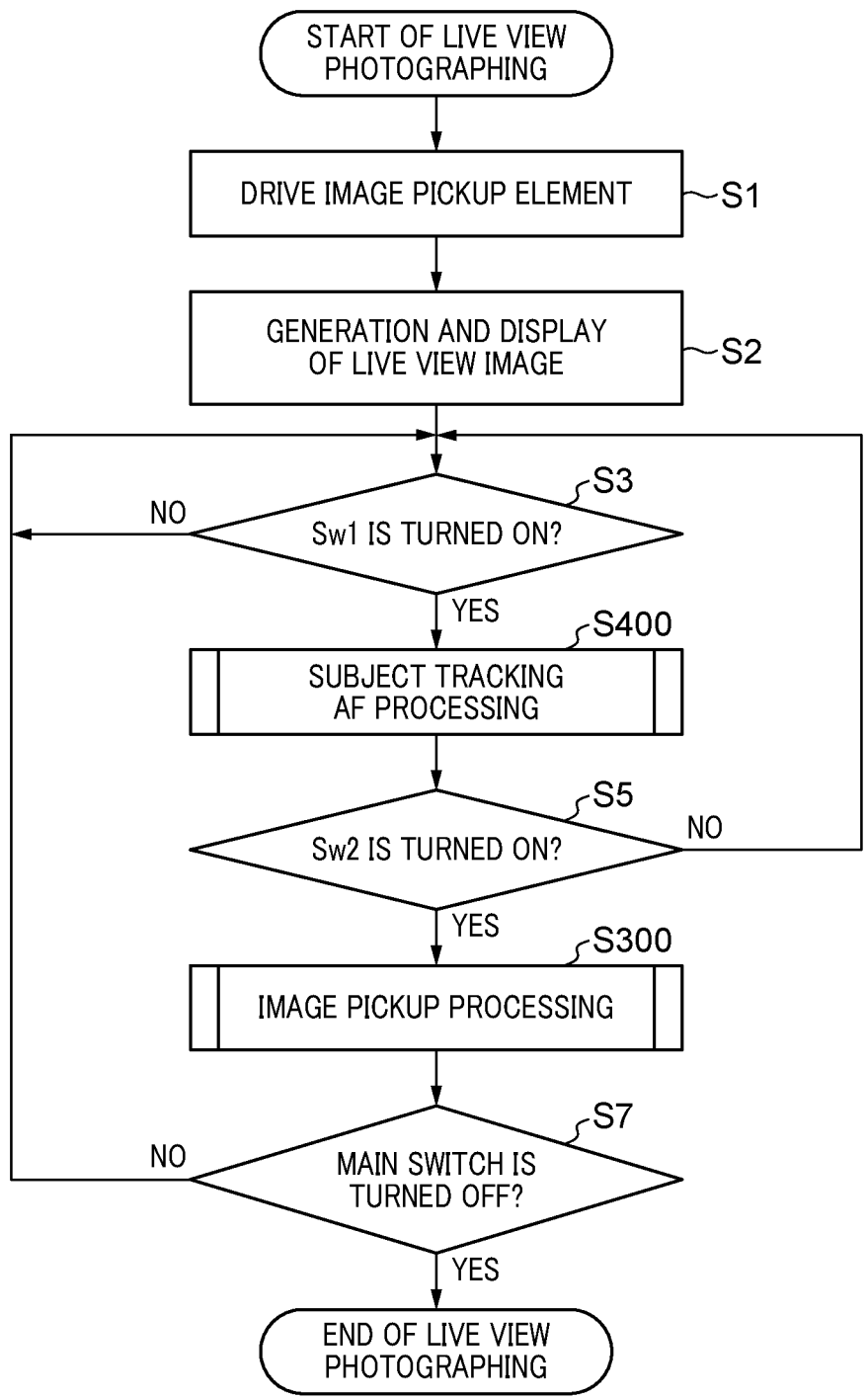
FIG. 8 is a flowchart that shows a flow of live view photographing of the image pickup apparatus according to the first embodiment.

Next, a flow of live view photographing of the image pickup apparatus (the camera 100) according to the first embodiment will be described. FIG. 8 is a flowchart that shows the flow of the live view photographing of the camera 100 according to the first embodiment. Specifically, FIG. 8 shows a processing of causing the camera 100 to perform operations from displaying a live view image on the display device 131 (i.e., before image pickup) to performing still image pickup. The CPU 121 executes the processing of FIG. 8 according to the computer program. Further, in the following description, S means a step.

At first, in S1, the CPU 121 causes the image pickup element driving circuit 124 to drive the image pickup element 107, and obtains image pickup data from the image pickup element 107. After that, the CPU 121 obtains the first focus detection signals and the second focus detection signals from a plurality of the first focus detection pixels and the second focus detection pixels included in each of the focus detection areas shown in FIG. 7 among the obtained image pickup data. Further, the CPU 121 adds the first focus detection signals and the second focus detection signals of all the effective pixels of the image pickup element 107 to generate the image pickup signals, and causes the image processing circuit 125 to perform the image processes with respect to the image pickup signals (the image pickup data) to obtain the image data. Moreover, in the case that the image pickup pixel, the first focus detection pixel, and the second focus detection pixel are separately provided, the CPU 121 performs complementing processes with respect to the focus detection pixel to obtain the image data.

Next, in S2, the CPU 121 causes the image processing circuit 125 to generate the live view image from the image data obtained in S1, and causes the display device 131 to display the generated live view image. Further, the live view image is a reduced image that matches a resolution of the display device 131, and the user can adjust an image pickup composition, exposure conditions, etc. while viewing the live view image. Therefore, the CPU 121 performs exposure adjustment based on a photometric value obtained from the image data and displays it on the display device 131. The exposure adjustment is realized by appropriately adjusting an exposure time, opening and closing of a diaphragm aperture of a photographing lens, and appropriately performing gain adjustment with respect to the output of the image pickup element.

Next, in S3, the CPU 121 determines whether or not a switch Sw1 (hereinafter, simply referred to as "Sw1"), which instructs starting of an image pickup preparation operation, is turned on by a half-pressing operation of the release switch included in the operation switch group 132. In the case that the CPU 121 determines in S3 that the Sw1 is not turned on, in order to monitor a timing, at which the Sw1 is turned on, the CPU 121 repeats determining performed in S3. On the other hand, in the case that the CPU 121 determines in S3 that the Sw1 is turned on, the CPU 121 advances the processing to S400, and performs a subject tracking AF processing (a subject tracking autofocus processing). In the subject tracking AF processing, based on the obtained image pickup signals and the obtained focus detection signals, detecting of a subject area, detecting of the focus area, setting of the focus detection area, a predictive AF processing for suppressing the influence of a time lag from a focus detection timing to an image exposure timing, etc. are performed. The details of "the subject tracking AF processing", which causes the camera 100 to perform a subject tracking AF operation will be described later.

After the CPU 121 performs the subject tracking AF processing, the CPU 121 advances the processing to S5, and determines whether or not a switch Sw2 (hereinafter, simply referred to as "Sw2"), which instructs starting of the image pickup operation, is turned on by a fully pressing operation of the release switch. In the case that the CPU 121 determines in S5 that the Sw2 is not turned on, the CPU 121 returns the processing to S3. On the other hand, in the case that the CPU 121 determines in S5 that the Sw2 is turned on, the CPU 121 advances the processing to S300, and executes the image pickup processing. The details of "the image pickup processing", which causes the camera 100 to perform the image pickup operation will be described later. When the image pickup processing is completed, the CPU 121 advances the processing to S7.

In S7, the CPU 121 determines whether or not the main switch included in the operation switch group 132 is turned off. In the case that the CPU 121 determines in S7 that the main switch is turned off, the CPU 121 ends the live view photographing. On the other hand, in the case that the CPU 121 determines in S7 that the main switch is not turned off, the CPU 121 returns the processing to S3.

In the first embodiment, such a configuration, in which after an ON state of the Sw1 is detected in S3 (that is, after it is determined that the Sw1 is turned on), the subject tracking AF processing is performed, is adopted, a timing of performing the subject tracking AF processing is not limited to this. By performing the subject tracking AF processing performed in S400 before the Sw1 is turned on, it is possible to eliminate the need for the photographer's preliminary operation before photographing.

Figure 9:
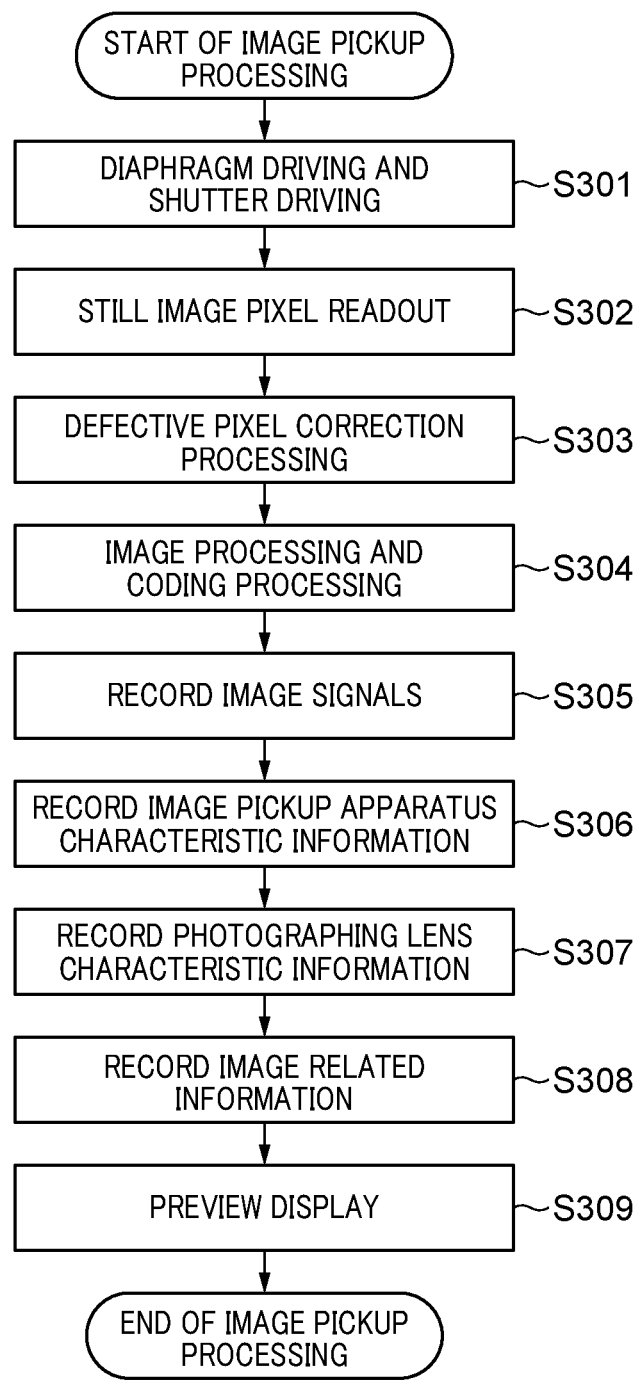
FIG. 9 is a flowchart that shows a flow of an image pickup processing according to the first embodiment.

Next, a flow of the image pickup processing executed by the CPU 121 in S300 of FIG. 8 will be described. FIG. 9 is a flowchart that shows the flow of the image pickup processing executed by the CPU 121 in S300 of FIG. 8.

In S301, the CPU 121 performs an exposure control processing, and determines image pickup conditions (a shutter speed, a diaphragm value, an image pickup sensitivity, etc.). This exposure control processing can be performed by using luminance information that is obtained from image data of the live view image. Then, in S301, the CPU 121 transmits the determined diaphragm value to the diaphragm driving circuit 128 to drive the diaphragm 102. Further, in S301, the CPU 121 transmits the determined shutter speed to the shutter 108 to perform an operation of opening the focal plane shutter. Furthermore, in S301, the CPU 121 causes the image pickup element 107 to perform charge accumulation during an exposure period through the image pickup element driving circuit 124.

In S302, the CPU 121, which has performed the exposure control processing, causes the image pickup element driving circuit 124 to perform full-pixel readout of the image pickup signals for still image pickup from the image pickup element 107. Further, the CPU 121 causes the image pickup element driving circuit 124 to perform readout of one of the first focus detection signals and the second focus detection signals from the focus detection area (an in-focus target area) within the image pickup element 107. The first focus detection signals or the second focus detection signals, which are read out at this time, are used to detect a focus state of the image during image reproduction described later. By subtracting one focus detection signal of the first focus detection signal and the second focus detection signal from the image pickup signal, it is possible to obtain another focus detection signal.

Next, in S303, the CPU 121 causes the image processing circuit 125 to perform a defective pixel correction processing with respect to the image pickup data that is read out in S302 and is A/D-converted.

Further, in S304, the CPU 121 causes the image processing circuit 125 to perform the image processes such as the demosaic processing, the white balance adjustment processing, the gamma correction processing (a gradation correction processing), a color conversion processing, and an edge enhancement processing, and a coding processing with respect to the image pickup data after the defective pixel correction processing.

Then, in S305, the CPU 121 records still image data as the image data, which is obtained by performing the image processes and the coding processing in S304, and one focus detection signal, which is read out in S302, in the flash memory 133 as an image data file.

Next, in S306, the CPU 121 records camera characteristic information (image pickup apparatus characteristic information) as characteristic information of the camera 100 (the image pickup apparatus), which is associated with the still image data recorded in S305, in the flash memory 133 and a memory (the RAM) within the CPU 121. The camera characteristic information includes, for example, the following information.

The image pickup conditions (the diaphragm value, the shutter speed, the image pickup sensitivity, etc.)

Information about the image processes that are performed by the image processing circuit 125

Information about light receiving sensitivity distributions of the image pickup pixels and the focus detection pixels of the image pickup element 107

Information about vignetting of the image pickup light flux within the camera 100

Information about a distance from a mounting plane of the image pickup optical system to the image pickup element 107 in the camera 100

Information about manufacturing error of the camera 100

The information about light receiving sensitivity distributions of the image pickup pixels and the focus detection pixels of the image pickup element 107 (hereinafter, simply referred to as "light receiving sensitivity distribution information") is information about the sensitivity of the image pickup element 107 according to a distance (a position) on the optical axis from the image pickup element 107. Since this light receiving sensitivity distribution information depends on the microlens 305, the photoelectric conversion unit 301, and the photoelectric conversion unit 302, it may be information about the microlens 305, the photoelectric conversion unit 301, and the photoelectric conversion unit 302. Further, the light receiving sensitivity distribution information may be information about a change in sensitivity with respect to an incident angle of light.

Next, in S307, the CPU 121 records lens characteristic information (photographing lens characteristic information) as characteristic information of the image pickup optical system, which is associated with the still image data recorded in S305, in the flash memory 133 and the memory (the RAM) within the CPU 121. The lens characteristic information includes, for example, the following information.

Information about the exit pupil

Information about a casing such as a lens barrel that turns down the light flux

Information about a focal length and F-number at the time of image pickup

Information about aberration of the image pickup optical system

Information about manufacturing error of the image pickup optical system

Information about a position (a subject distance) of the focus lens 105 at the time of image pickup Next, in S308, the CPU 121 records image related information as information about the still image data, in the flash memory 133 and the memory (the RAM) within the CPU 121. The image related information includes, for example, information about the focus detection operation before image pickup, information about the movement of the subject, and information about a focus detection accuracy.

Next, in S309, the CPU 121 causes the display device 131 to perform a preview display of the picked-up image. This allows the user to easily confirm the picked-up image. When the processing performed in S309 is completed, the CPU 121 ends the image pickup processing, and advances the processing to S7 of FIG. 8.

Figure 10:
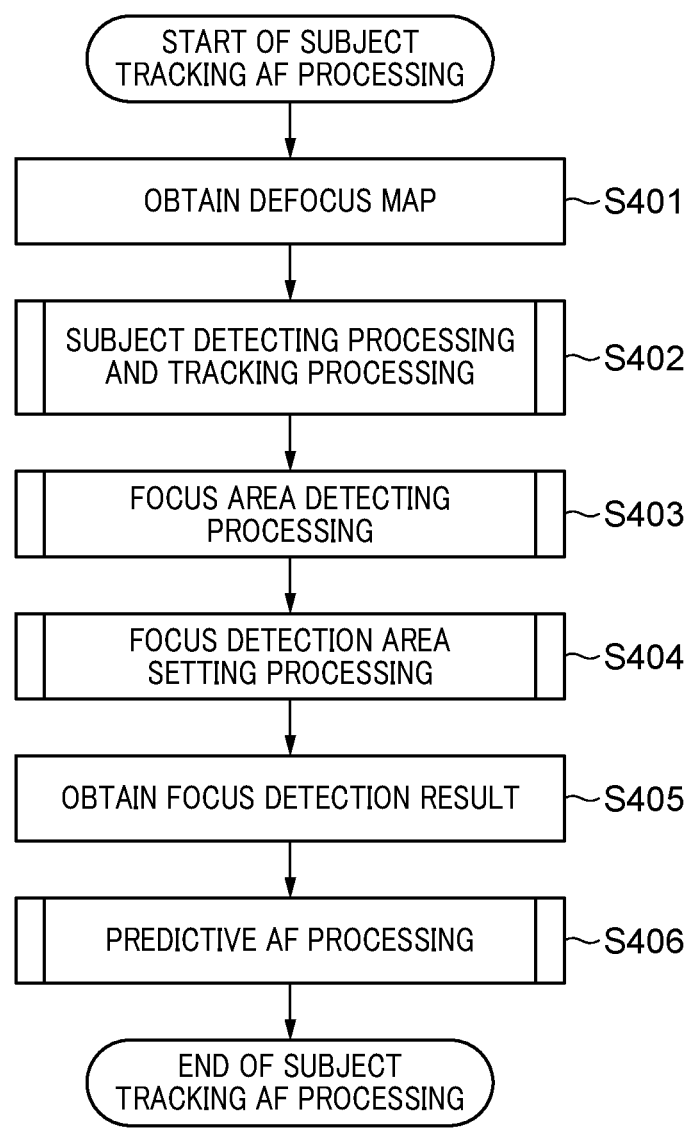
FIG. 10 is a flowchart that shows a flow of a subject tracking AF processing according to the first embodiment.

Next, a flow of the subject tracking AF processing executed by the CPU 121 in S400 of FIG. 8 will be described. FIG. 10 is a flowchart that shows the flow of the subject tracking AF processing executed by the CPU 121 in S400 of FIG. 8.

In S401, the CPU 121 calculates the image shift amount of the subject image between the first focus detection signal and the second focus detection signal obtained in each of a plurality of focus detection areas obtained in S2, and calculates the defocus amount for each focus detection area on the basis of the calculated image shift amount. In this way, the CPU 121 obtains the defocus map by calculating the defocus amount for each focus detection area. As described above, in the first embodiment, a group of focus detection results, which are obtained from the total of 9600 focus detection areas of 120 horizontal divisions and 80 vertical divisions arranged on the image pickup element 107, is referred to as the defocus map.

Next, in S402, the CPU 121 performs the subject detecting processing and a tracking processing. The subject detecting unit 140 described above performs the subject detecting processing that detects the subject area. In the subject detecting processing, since it may not be possible to detect the subject area depending on the state of the obtained image, in such a case, the CPU 121 performs the tracking processing that uses other means such as template matching, and estimates the position of the subject. The details of the subject detecting processing and the tracking processing will be described later.

Subsequently, in S403, the CPU 121 causes the focus area detecting unit 142 to perform a focus area detecting processing that detects the focus area. The details of the focus area detecting processing will be described later. In the present invention, in S402, the subject detecting unit 140 (a first detecting unit) performs a detecting processing of the subject area (the subject detecting processing), and in S403, the focus area detecting unit 142 (a second detecting unit, a detecting unit) performs a detecting processing of the focus area (the focus area detecting processing).

Hereinafter, a difference between the detecting processing of the subject area and the detecting processing of the focus area will be described.

In the detecting processing of the subject area, in the case that the subject is a person, a face area or a pupil area of the person is detected as the subject area. Further, in the case that the subject is a vehicle such as a motorcycle, in the detecting processing of the subject area, an area of the entire motorcycle body of the motorcycle or an area of a helmet worn by a driver who is driving the motorcycle is detected as the subject area. In other words, in the detecting processing of the subject area, in the case that the subject is a living thing, the whole body or an organ of the living thing is detected, and in the case that the subject is a non-living thing such as a vehicle, a component part having a certain function of the non-living thing (for example, a tire of the vehicle, a handle of the vehicle, etc.) is detected.

On the other hand, in the detecting processing of the focus area, according to the photographing scene (information about the photographing scene of the subject), an area that the photographer wants to focus (hereinafter, also referred to as "an area desired to be focused") is detected as the focus area. For example, in the case that the subject is a person, in a photographing scene that the person's face is photographed relatively large with a shallow depth of field and the person is facing diagonally forward, the detecting processing of the focus area detects an area of eyelashes of the person's eye on front side (an eyelash area) as the focus area. Further, in the case that the subject is a person, in a photographing scene that the person's face is photographed relatively large with a shallow depth of field and one eye of the person is closed, the detecting processing of the focus area detects a pupil area of the person's open eye as the focus area. In any one of photographing scenes, in the detecting processing of the subject area (the subject detecting processing) that is performed in S402, the pupil area is detected as the subject area.

In the first embodiment, although in an area different from the pupil area, the eyelash area is detected as the focus area, there is a possibility that eyelashes have a large gap and the focus detection cannot be performed properly. In such a case, the display is performed by the eyelash area, but the focus detection may be performed by adding a pre-registered offset amount to the result obtained by performing the focus detection in the pupil area to adjust the focus.

Further, similarly, when photographing in a motorcycle road race, the subject is often the motorcycle and its driver. When the motorcycle being raced is cornering in a direction of becoming closer to the photographer, the motorcycle body of the motorcycle tilts toward the photographer side (the front side), and when the motorcycle being raced is cornering in a direction away from the photographer, the motorcycle body of the motorcycle tilts toward the side away from the photographer (the back side). In such a photographing environment, depending on the photographing scene, the area that the photographer wants to focus may be an area of an organ of the driver being a living thing, or an area of a component part of the motorcycle being a non-living thing, and is not uniquely determined. For example, in the photographing scene that the motorcycle body of the motorcycle is tilted toward the front side, the area that the photographer wants to focus becomes the area of the helmet, and in the photographing scene that the motorcycle body of the motorcycle is tilted toward the back side, the area that the photographer wants to focus becomes an area of a body near an engine or a gasoline tank. This is because, when photographing an image with a shallow depth of field to some extent, if the in-focus area of the subject is on the far back side, unnaturalness will occur.

In S402, a specific area of the subject is fixedly detected, and an orientation of the subject is also detected. In S403, the area desired to be focused by the photographer is statistically detected from the orientation of the subject (for example, atilt direction of the motorcycle body), the photographing environment (for example, a subject size, a shallowness of the depth of field), a background environment, etc. The area detected in S402 is a first local area (an area corresponding to at least a part of the subject area), and the area detected in S403 is a second local area (an area corresponding to at least a part of the subject area). Further, in S402, the subject detecting unit 140 detects an area, which shows subject characteristics, such as the whole body or an organ of a person when the subject is the person and a component part of a vehicle when the subject is the vehicle, as the subject area (the first local area). In S403, the focus area detecting unit 142 detects an area, which shows photographing scene characteristics, such as a pattern of the subject, the subject size, the depth of field, and atilt direction of the subject, as the focus area (the second local area). The area, which shows the photographing scene characteristics, is also an area corresponding to characteristics of an in-focus target.

Next, in S404, the CPU 121 performs a focus detection area setting processing that sets the focus detection area (an area to be focused) by using information about the subject detection area obtained in S402 and information about the focus area as the area desired to be focused obtained in S403. The information about the subject detection area obtained in S402 is a subject detection result. In S404, the CPU 121 functions as a local area selecting unit. The details of the focus detection area setting processing will be described later.

Next, in S405, the CPU 121, which functions a focus detection unit, obtains the focus detection result (the defocus amount) of the focus detection area, which is set by the focus detection area setting processing of S404. As the focus detection result obtained in S405, the focus detection result close to a desired area may be selected from the focus detection results calculated in S401 (the defocus map obtained in S401). Further, as the focus detection result obtained in S405, the defocus amount may be newly calculated by using the focus detection signals corresponding to the focus detection area that is set. Further, the focus detection area for calculating the defocus amount is not limited to one, and may be a plurality of focus detection areas arranged around for calculating the defocus amount.

Next, in S406, the CPU 121 performs the predictive AF processing by using the defocus amount obtained in S405 and time-series data of the defocus amount obtained in the past. The predictive AF processing is a processing that is required when there is a time lag between the timing of performing focus detection (hereinafter, referred to as "a focus detection time") and the timing of performing image exposure. The predictive AF processing is a processing that predicts the position of the subject at a time after a predetermined period of time has elapsed from the focus detection time and performs AF control. The details of the predictive AF processing will be described later.

When the predictive AF processing performed in S406 is completed, the CPU 121 ends the subject tracking AF processing, and advances the processing to S5 of FIG. 8.

Figure 11:
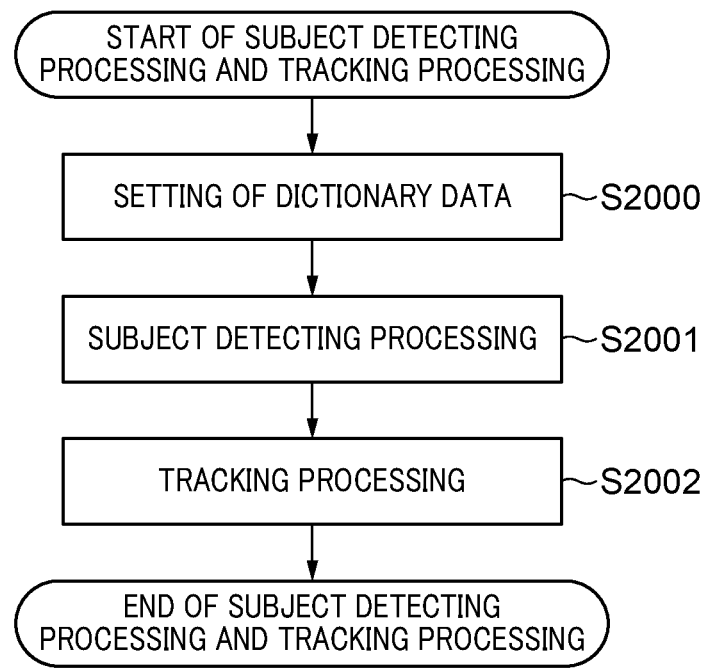
FIG. 11 is a flowchart that shows a flow of a subject detecting processing and a tracking processing according to the first embodiment.

Next, the subject detecting processing and the tracking processing executed by the CPU 121 in S402 of FIG. 10 will be described. FIG. 11 is a flowchart that shows a flow of the subject detecting processing and the tracking processing executed by the CPU 121 in S402 of FIG. 10.

In S2000, the CPU 121 performs setting of dictionary data according to the type of the subject to be detected from data detected from the image data obtained in S2. Specifically, in S2000, based on the preset subject priorities and the settings of the camera 100 (the image pickup apparatus), the dictionary data used in the subject detecting processing and the tracking processing is selected (set) from a plurality of dictionary data stored in the dictionary data storage unit 141. For example, as the plurality of dictionary data, subjects such as "person", "vehicle", and "animal" are classified and stored. In the first embodiment, the dictionary data to be selected may be one or a plurality. In the case of selecting one dictionary data, it becomes possible to repeatedly detect a subject that can be detected by one dictionary data with a high frequency. On the other hand, in the case of selecting a plurality of dictionary data, it is possible to sequentially detect the subject by sequentially setting the dictionary data according to the priority as the detected subject.

Next, in S2001, the subject detecting unit 140 sets the image data that is read out in S2 as an input image, and performs the subject detection by using the dictionary data that is set in S2000. At this time, the subject detecting unit 140 outputs the detected information such as the position, the size, and the reliability of the subject as the information about the subject detection area. At this time, the CPU 121 may display the information about the subject detection area, which is outputted from the subject detecting unit 140, on the display device 131. Further, in S2001, the subject detecting unit 140 hierarchically detects a plurality of areas of the subject as the subject detection area from the image data. For example, in the case that "person" or "animal" is set as the dictionary data in S2000, the subject detecting unit 140 hierarchically detects a plurality of areas such as a "whole body" area, a "face" area, and an "eye" area as the subject detection area. The detected "whole body" area is a global area that indicates the whole body of the subject, and the detected "face" area and the detected "eye" area are local areas that indicate the organs of the subject. The local areas such as the "face" area and the "eye" area of a person or an animal are areas desired to be focused as the subject, but may not be detected due to surrounding obstacles or an orientation of the face. In the present invention, since even in such a case, by performing detecting of the whole body, the subject will continue to be detected robustly, the subject detecting unit 140 is configured to detect the subject hierarchically. Similarly, in the case that "vehicle" is set as the dictionary data in S2000, as the subject detection area, the subject detecting unit 140 hierarchically detects a global area, which includes a driver of a vehicle and a body of the vehicle, and an area of the driver's helmet (the driver's head) as a local area. In the present invention, in the case that "vehicle" is set as the dictionary data, the subject detecting unit 140 is configured to detect the subject hierarchically by performing detecting of the entire vehicle including the driver of the vehicle and the body of the vehicle.

Next, in S2002, the CPU 121 uses the subject detection area obtained in S2001 as a template, and performs a publicly-known template matching processing. Using a plurality of images obtained in S2, a similar area is searched within the image obtained immediately before, by using the subject detection area obtained in the past image as a template. As is well known, information used for template matching may be any of the luminance information, color histogram information, feature point information such as corners and edges, etc. Various methods can be considered for the matching method and the template update method, but any method may be used. The tracking processing performed in S2002 is performed in order to realize the stable subject detecting processing and the stable tracking processing by detecting the similar area from the image data obtained immediately before and base on past subject detection data when the subject is not detected in S2001.

When the tracking processing performed in S2002 is completed, the CPU 121 ends the subject detecting processing and the tracking processing, and advances the processing to S403 of FIG. 10.

Figure 12:
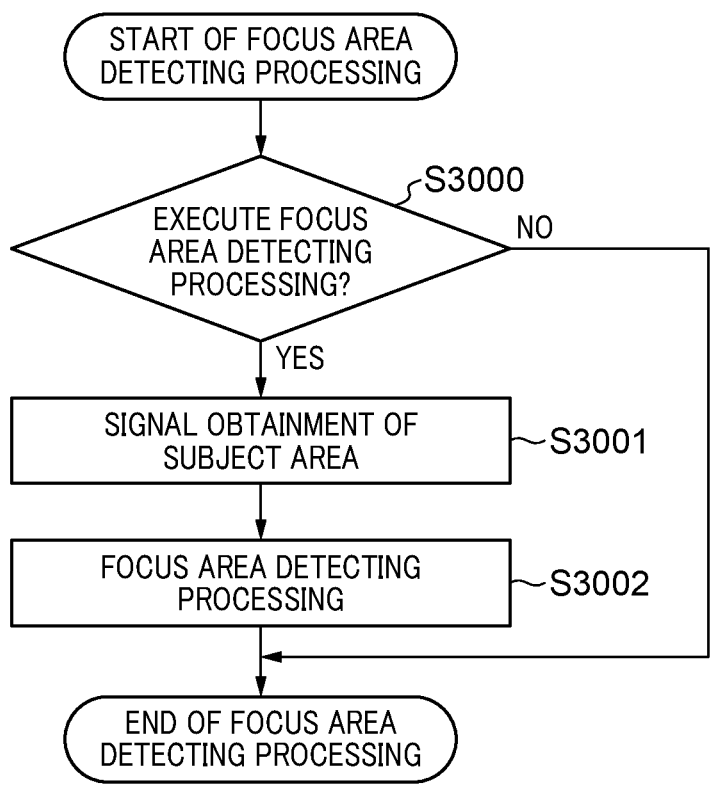
FIG. 12 is a flowchart that shows a flow of a focus area detecting processing according to the first embodiment.

Next, the focus area detecting processing executed by the CPU 121 in S403 of FIG. 10 will be described. FIG. 12 is a flowchart that shows a flow of the focus area detecting processing executed by the CPU 121 in S403 of FIG. 10.

In S3000, the CPU 121 determines whether or not to execute the focus area detecting processing. As described above, the focus area is the area within the subject that should be focused, and the focus area detecting processing is a processing for detecting an area different from the subject detection area detected by the subject detecting processing described with reference to FIG. 11 (the focus area). Therefore, in the case that it is inappropriate or impossible to detect the area that should be focused within the subject, the focus area detecting processing is skipped. In the case that a size of the subject area detected in S402 is smaller than a predetermined size, or in the case that a depth difference within the subject in the photographing settings or live view settings is smaller than a predetermined value, the focus area detecting processing is skipped. In these cases, since becoming a state, in which it is difficult to visually recognize a difference between focus states (a difference between an in-focus area and an out-of-focus area) within the subject area, the focus area detecting processing is skipped.

The case that the size of the subject area is smaller than the predetermined size becomes the state, in which it is difficult to visually recognize the difference between focus states within the subject area. Therefore, in the first embodiment, in S3000, in the case that the size of the subject area is smaller than the predetermined size, the CPU 121 determines to skip the focus area detecting processing.

Also, as is well known, the depth difference within the subject is determined by the subject distance, and the aperture diameter of the diaphragm of the photographing optical system. Further, as is well known, the farther the subject distance is, or the smaller the aperture diameter of the diaphragm is, the deeper the depth is, and within the subject area, an area that is in an acceptable blurred state (the focus state) expands. That is, within the subject area, an area that becomes within the depth expands. As a result, it becomes the state, in which it is difficult to visually recognize the difference between focus states within the subject area. Therefore, in the first embodiment, in S3000, in the case that the depth difference of the subject area is smaller than the predetermined value, the CPU 121 determines to skip the focus area detecting processing.

As described above, in S3000, in the case that the CPU 121 determined not to execute the focus area detecting processing (that is, in the case that the CPU 121 determined to skip the focus area detecting processing), the CPU 121 ends the focus area detecting processing, and advances the processing to S404 of FIG. 10.

On the other hand, in S3000, in the case that the CPU 121 determined to execute the focus area detecting processing, the CPU 121 advances the processing to S3001 to perform signal obtainment of the subject area. That is, in S3001, the CPU 121 obtains image data of all the subject detection areas including the global area and the local area, which are hierarchically detected by the subject detecting unit 140. As described above, in the case that the subject is a living thing such as a person or an animal, the global area of the subject is an area of the whole body of the living thing, and in the case that the subject is a vehicle such as a motorcycle, the global area of the subject is an area including the vehicle and a driver of the vehicle. As a result of performing the subject detecting processing and the tracking processing described in S402 based on the image data obtained in S2, the subject detecting unit 140, which functions as a third detecting unit, outputs the detection result of the global area detected as the subject detection area (signals of the global area). In the case that there is a plurality of the subject areas (the subject detection areas) detected by the subject detecting unit 140, the focus area detecting processing performed in S3002 will be performed a plurality of times.

Next, in S3002, the CPU 121 causes the focus area detecting unit 142 to perform the focus area detecting processing that performs the detecting of the focus area. As described above, according to the instruction of the CPU 121, the focus area detecting unit 142 detects the area that should be focused as the focus area based on the state of the subject in the subject area (the subject detection area) detected by the subject detecting unit 140. In the focus area detecting processing, only one area may be detected as the focus area, or a plurality of areas may be detected as the focus area. In the case that the plurality of areas is detected as the focus area, by the image pickup apparatus (the camera 100) automatically selecting the plurality of detected areas, or the photographer selecting the plurality of detected areas, the area that should be focused is set appropriately. At this time, the CPU 121 may display the information about the focus area, which is outputted from the focus area detecting unit 142, on the display device 131.

When the focus area detecting processing (in the case that there is a plurality of the subject detection areas, a plurality of times of the focus area detecting processing) performed in S3002 is completed, the CPU 121 ends the focus area detecting processing, and advances the processing to S404 of FIG. 10.

Figure 13:
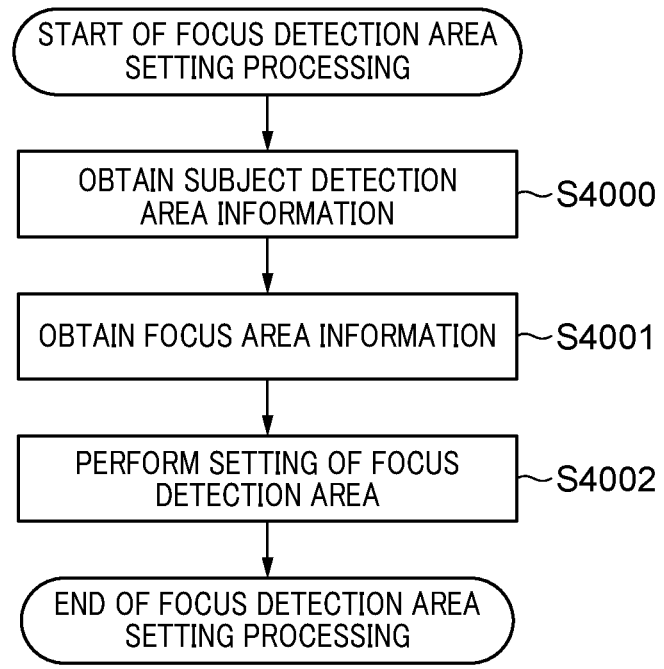
FIG. 13 is a flowchart that shows a flow of a focus detection area setting processing according to the first embodiment.

Next, the focus detection area setting processing executed by the CPU 121 in S404 of FIG. 10 will be described. FIG. 13 is a flowchart that shows a flow of the focus detection area setting processing executed by the CPU 121 in S404 of FIG. 10.

In S4000, the CPU 121 obtains the information such as the position, the size, and the reliability of the subject as the information about the subject detection area, which is obtained as the output of the subject detecting processing and the tracking processing performed in S402. Next, in S4001, the CPU 121 obtains information such as a position, a size, and a reliability of the focus area as the information about the focus area, which is obtained as the output of the focus area detecting processing performed in S403.

Next, in S4002, the CPU 121 performs the setting of the focus detection area by using the information about the subject detection area obtained in S4000 and the information about the focus area obtained in S4001. The setting of the focus detection area may be performed by selecting a focus detection result with high reliability that shows the subject at a relatively close distance, from the result of the focus detection areas within the areas that are set as the subject detection area and the focus area. Further, the setting of the focus detection area may be performed by such a way, that is, the focus detection area is arranged again within the obtained areas that are set as the subject detection area and the focus area, the image data and the focus detection signals are obtained again, and similarly, selecting of the focus detection result is performed.

The following methods can be used for selecting an area to be used in the setting of the focus detection area from the subject detection area and the focus area. In the case that only one of the subject detection area and the focus area is detected, the detected area is set as the focus detection area. In the case that neither the subject detection area nor the focus area is detected, the focus detection area is set at the same position as a prior focus detection area. In the case that both the subject detection area and the focus area are detected, the focus area has priority over the subject detection area, and the focus area is set as the focus detection area. Further, in the case that both the subject detection area and the focus area are detected, depending on the information about the photographing scene of the subject, the subject detection area may be set as the focus detection area, or the focus area may be set as the focus detection area. The camera 100 (the image pickup apparatus) may be configured to display the focus detection area that is set on the display device 131. Further, the camera 100 (the image pickup apparatus) may be configured so that the subject detection area, the focus area, and the focus detection area can be displayed separately or selectively.

When the setting of the focus detection area performed in S4002 is completed, the CPU 121 ends the focus detection area setting processing, and advances the processing to S405 of FIG. 10.

Next, the focus area detected by the focus area detecting processing performed in S403 will be described with reference to FIG. 14A, FIG. 14B, FIG. 14C, FIG. 14D, and FIG. 15. FIG. 14A, FIG. 14B, FIG. 14C, and FIG. 14D show examples of a scene, in which the photographer wants to perform photographing, in the case that a motorcycle and a driver are subjects.

Figure 14A:
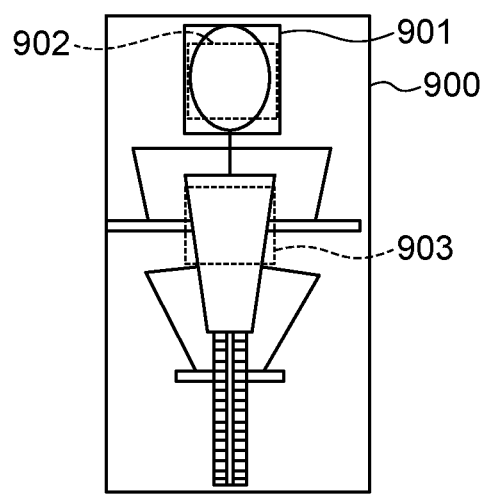
FIG. 14A, FIG. 14B, FIG. 14C, and FIG. 14D are diagrams for explaining focus areas that are detected by the focus area detecting processing of the first embodiment.
Figure 14B:
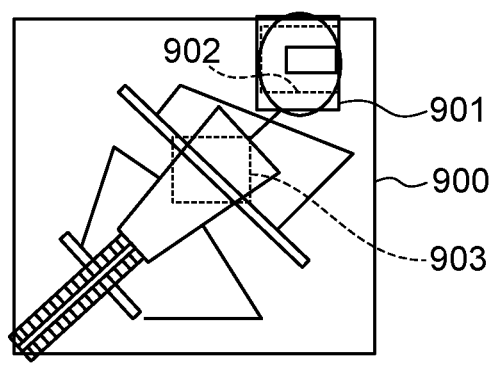
Figure 14C:
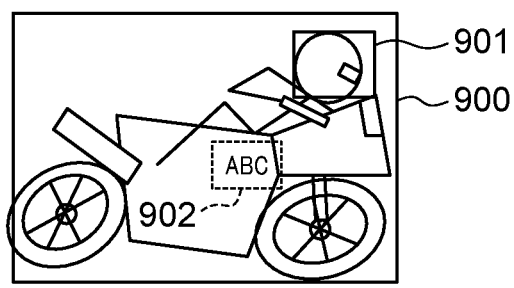
Figure 14D:
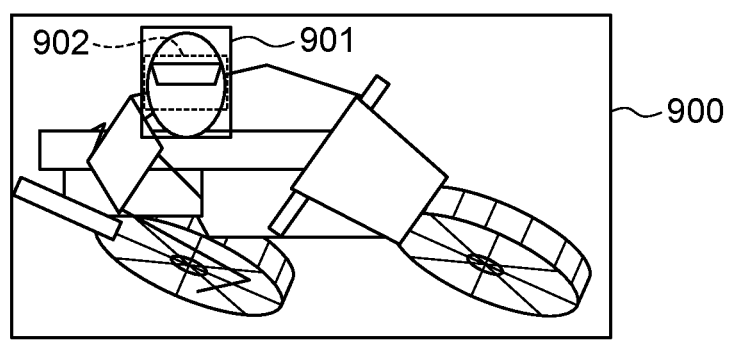

FIG. 14A shows a state, in which the motorcycle and the driver are traveling in a direction of approaching the camera 100 (the image pickup apparatus) as a traveling direction. FIG. 14B shows a state, in which the motorcycle and the driver are trying to corner to the left side as viewed from the driver while approaching the front. FIG. 14C shows a state of performing photographing from a side face of the motorcycle in a scene, in which the motorcycle and the driver are trying to corner to the left side as viewed from the driver. FIG. 14D shows a state of performing photographing from the side face of the motorcycle in a scene, in which the motorcycle and the driver are trying to corner to the right side as viewed from the driver. Each of FIG. 14A, FIG. 14B, FIG. 14C, and FIG. 14D shows a global area 900 and a local area 901 as the subject area (the subject detection area) detected in S402. Similarly, each of FIG. 14A, FIG. 14B, FIG. 14C, and FIG. 14D shows a local area 902 and/or a local area 903 as the focus area detected in S403.

Each of FIG. 14A and FIG. 14B shows that the driver's head is detected as the local area 901 of the subject detection, and the local area 902 and the local area 903 are detected as the focus area. A thing that a plurality of areas (the local area 902 and the local area 903) are detected as the focus area is because there is a case that an image focused on either of them may be desired depending on the photographer's preference and intention. In S4002, when the CPU 121 performs the setting of the focus detection area, the CPU 121 determines the priority of the focus area in consideration of the setting of the image pickup apparatus such as "the driver is prioritized" and "a short-range is prioritized", a position within the image of the detection area in a photographing range, a continuity with setting of the prior focus detection area, etc. For example, in the case that the CPU 121 determined that the short-range is prioritized, the CPU 121 sets the focus area 903 as the focus detection area.

FIG. 14C shows that the driver's head is detected as the local area 901 of the subject detection, and the local area 902 is detected as the focus area. Further, in the photographing scene shown in FIG. 14C, the body of the motorcycle is tilted toward the back side from the camera 100 (the image pickup apparatus). Therefore, a depth difference occurs between the local area 902, which is a body part of the motorcycle, and the subject detection area 901. In such a situation, an image in focus on the local area 902, in which, the short-range is prioritized, is often preferred. Therefore, in the case of the photographing scene of FIG. 14C, the focus area detecting processing of the present invention does not detect the local area 901 of the head as the focus area, but detects the local area 902 of the body part as the focus area.

In the photographing scene shown in FIG. 14D, since the body of the motorcycle is tilted toward the front side, it is close to the area of the head, which is an important organ as the subject, and the areas desired to be focused match. Therefore, a state, in which the local area 901 detected by the subject detection and the local area 902 detected by the focus area detection are superimposed, is shown in FIG. 14D.

Moreover, although the subject detection area and the focus area have been described with reference to FIG. 14A, FIG. 14B, FIG. 14C, and FIG. 14D, in which the subject detection area includes the focus area, in the present invention, a size relationship between the subject detection area and the focus area is not limited to this.

As described above, in the present invention, not only the head or the pupil is detected as the important organ at the time of photographing, but also the focus area is detected as an area different from the subject detection area depending on the photographing scene, and as a result, it is possible to perform the focus adjustment that better suits the photographer's intention.

As a photographing scene, for which the detection of the focus area is effective, various cases are possible. FIG. 15 shows main examples of scenes, in which detection as the focus area can be effective.

As shown in FIG. 15, when performing photographing of a portrait with the subject being a "person", in the case that the right side of the face is close to the camera 100 (the image pickup apparatus), in general, the right eye of the subject is often focused on. Therefore, the right eye is detected as the important organ in the subject detection, and the right eye is also detected in the focus area detection. By performing detecting of the focus area of the present invention (the focus area detecting processing performed in S403 of FIG. 10), in the case of a photographing scene, in which the face of a person is large and the depth is shallow, the eyelash area of the right eye is detected as the focus area. This makes it possible to obtain a high-contrast image of the eyelashes whose focus state is easier to understand.

Further, in the case that the subject is a "motorcycle", as described with reference to FIG. 14A, FIG. 14B, FIG. 14C, and FIG. 14D, when photographing from the front with respect to the traveling direction, both the subject detection and the focus area detection detect the helmet, and the focus adjustment is performed with respect to the helmet. The case that the body of the motorcycle is tilted toward the front side is also the same. On the other hand, in the case that the body of the motorcycle is tilted toward the back side, although the subject detection detects the helmet (the head) as the important organ, the focus area detection detects the body area near the engine as the focus area.

Further, in the case that the subject is a "car (for example, a racing car used in Formula One (F1) motor racing)", in a photographing scene of photographing from slightly above and the front with respect to the traveling direction, the subject detection detects the helmet (the head) as the important organ. However, in the above-mentioned photographing scene, in order to keep (fit) the entire car body within the depth, as the focus area, a position in front of the driver's seat is detected. This is because when photographing a racing car used in F1 motor racing from above and the front, there is a depth of the car body, and when focusing on the helmet (the head), the front of the car body goes out of the depth and becomes out of focus. When performing the machine learning of the CNN that constitutes the focus area detecting unit 142 (hereinafter, referred to as "a focus area detection CNN"), the above-mentioned detection is realized by setting the focus area for each photographing direction of the image of the racing car and learning. In such a photographing scene, it is conceivable to output required depth information as the output of the focus area detection. Further, diaphragm value information, etc. of the photographing optical system so that the entire car body fits within the depth may be outputted. By setting the focus detection area based on the detection of the focus area, and setting the diaphragm value as necessary, it is possible to obtain an image of keeping the entire car, which spreads in a depth direction, within the depth.

In the case that the subject is a "car (for example, a racing car used in F1 motor racing)", in a photographing scene of photographing from the side face with respect to the traveling direction, although the subject detection detects the helmet (the head) as the important organ, the focus area detection detects an area of the side face of the car body as the focus area. This is because the helmet (the head) is on the back side than the car body, and is the same reason as in the case that the body of the motorcycle is tilted toward the back side.

Next, a difference between the machine learning of the focus area detection CNN for realizing the focus area detection and the machine learning of the CNN that constitutes the subject detecting unit 140 (hereinafter, referred to as "a subject detection CNN") for realizing the subject detection will be described.

The collection of an image group, to which the teacher data for the focus area detection is added, will be described. First, with respect to the image, to which the teacher data at the time of machine learning is added, the subject detection is performed with respect to the collected image group, and the image, in which a desired subject is detected, is extracted. The image, in which there is a depth difference within the detected subject area, is extracted by using a contrast distribution within the subject area and corresponding defocus map information. It is determined that there is a depth difference in the case that there are a high-contrast part and a shallow-contrast part within the subject area, or in the case that there are an area where the defocus amount is small and an area where the defocus amount is large from the defocus map information. On the other hand, in the case that there is no depth difference in the subject area (in the case that there is no difference in contrast or in the case that the distribution of the defocus amount is within a predetermined value), the image data is learned as a negative sample. By performing the machine learning by using such a method, it is possible to realize the focus area detection CNN, in which the focus area detection is performed in the case that there is a depth difference within the subject detection area and the focus area detection is not performed in the case that there is no depth difference within the subject detection area.

Although the teacher data may be added to the extracted images while checking the images one by one, in the case that it is known that there is a high-contrast area or an area where the defocus amount is small within the subject area, the teacher data can be added automatically. Further, after the teacher data is automatically added, fine modification of the teacher data may be performed manually.

In order to efficiently collect learning data (the training data), it is possible to perform data augmentation. Well-known data augmentation methods include parallel translation, enlargement/reduction, rotation, noise addition, and blurring addition. In the present invention, as an effective data augmentation method for the focus detection area, regarding the blurring addition, a method of adding blurring to an area other than the focus area is used instead of a well-known method of adding blurring to the entire image or the entire subject area. As a result, it is possible to obtain image data corresponding to different depth differences within the subject area from one image, to which the teacher data is added. Further, by making the level of blurring to be added different for each image, it is possible to make the blurred state of the area other than the focus area that is the teacher data different, and it is possible to perform a robust learning with respect to the case of photographing with different aperture diameters of the diaphragm of the photographing optical system. As a method of adding blurring, it is possible to use a method of increasing the blurring to be added according to a distance from the focus detection area, or a method of making the presence or absence of the blurring addition different between the focus detection area and the area other than the focus area, and appropriately processing a boundary area. Further, the level of blurring to be added to the area other than the focus area may be set according to a change in the aperture diameter of the diaphragm. As a result, it is possible to generate the learning data that is close to images actually photographed.

Further, in the first embodiment, the image data is inputted into the focus area detection CNN, but input data of the focus area detection CNN is not limited to the image data. As the input data of the focus area detection CNN, in addition to the image data, by also inputting information such as a contrast map or the defocus map, by which the depth can be inferred, into the focus area detection CNN, it is possible to detect the focus area more appropriately. In that case, when the machine learning of the focus area detection CNN is performed, in addition to the image data, the contrast map or the defocus map may be prepared for the machine learning.

Figure 16:
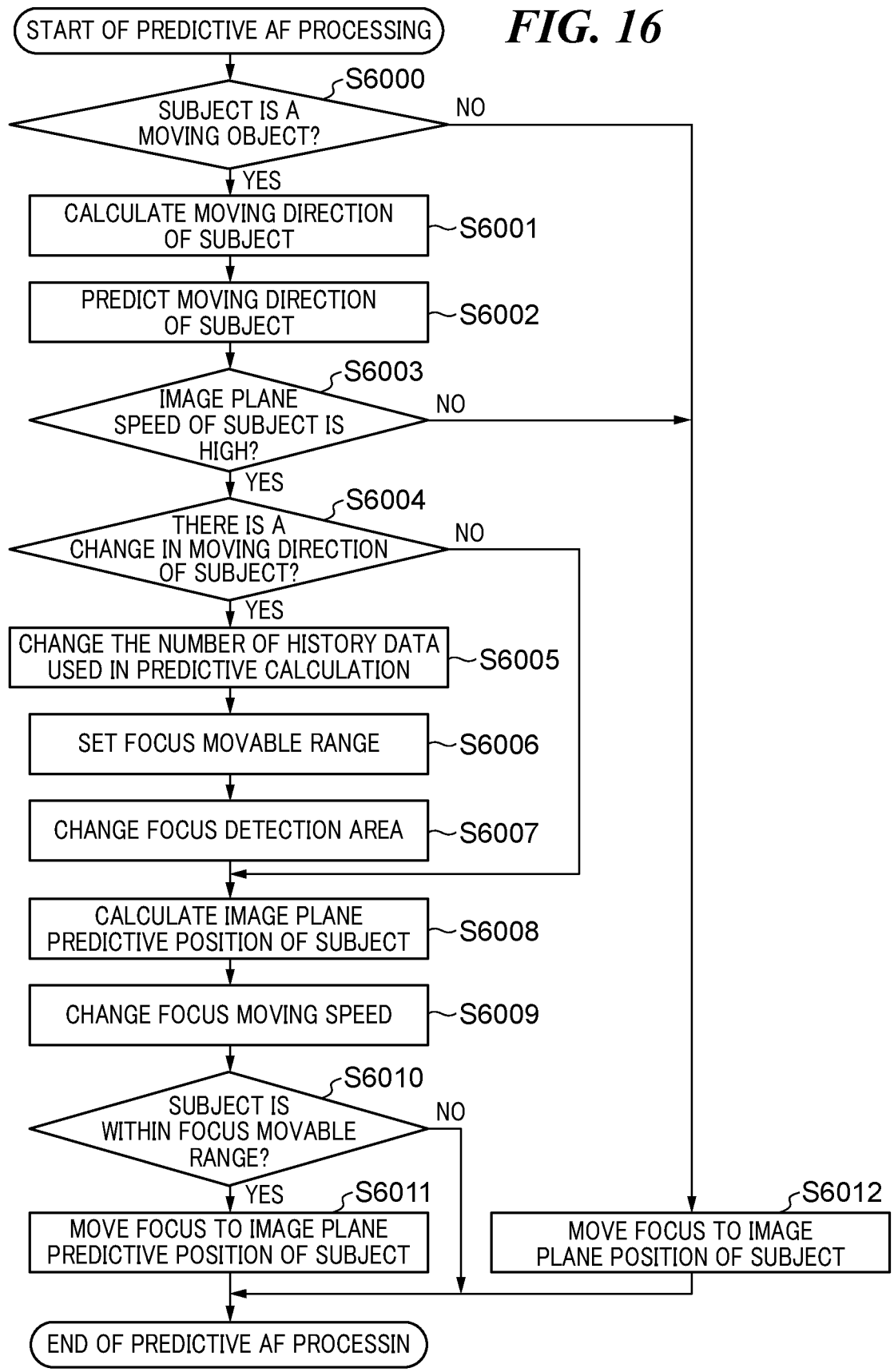
FIG. 16 is a flowchart that shows a flow of a predictive AF processing according to the first embodiment.

Next, the predictive AF processing executed by the CPU 121, which functions as a control unit, in S406 of FIG. 10 will be described. FIG. 16 is a flowchart that shows a flow of the predictive AF processing executed by the CPU 121 in S406 of FIG. 10.

In S6000, the CPU 121 determines whether or not the subject is a moving object that moves in the optical axis direction. Specifically, the CPU 121 determines whether or not the subject is moving in the optical axis direction by referring to the time-series data of the defocus amount obtained in the past and determining whether or not adjacent differences of a plurality of time-series data have the same code. In S6000, in the case that the CPU 121 determines that the subject is a moving object that moves in the optical axis direction, the CPU 121 advances the processing to S6001.

On the other hand, in S6000, in the case that the CPU 121 determines that the subject is not a moving object that moves in the optical axis direction, the CPU 121 advances the processing to S6012.

In S6001, the CPU 121 calculates a moving direction of the subject that is detected by the latest image data. The orientation of the said subject has already been detected by the subject detecting processing and the tracking processing performed in S402. As a method of calculating the moving direction of the subject, there are a method of using local detection within the subject (for example, face, eye, etc.) and a method of using a posture detection result of the subject.

First, the method of using the local detection within the subject (for example, face, pupil, etc.) will be described. The local detection within the subject means that in the case that the subject is a person, a local detection area is the person's pupil, head, or body, and in the case that the subject is a vehicle such as a motorcycle, the local detection area is the driver's head (a helmet part) of the vehicle. In the case that the subject is only a person, a known method will be described. The local detection area is the pupil, in the case that both pupils are detected, the moving direction of the subject is set to the optical axis direction, in the case that only the right pupil is detected, the moving direction of the subject is set to a right direction, and in the case that only the left pupil is detected, the moving direction of the subject is set to a left direction. In the case that the subject is not only a person (for example, in the case that a motorcycle is also included), the position of the pupil may not be known, or the detection of the pupil and the moving direction of the subject may be different. In the present invention, in such a case, the moving direction of the detected subject is estimated based on the size of a rectangular frame that shows a range of the entire detected subject, and a positional relationship of the local detection area within the detected subject with respect to the range of the entire detected subject. Here, a case that a motorcycle and a driver are the subjects will be described as an example. In the case that a vertical length of an aspect ratio of the detection range of the entire subject is long and a horizontal length of the aspect ratio is short, and a position of the local detection area (the driver's helmet in this example) is on the upper side of the range of the entire detected subject, it is assumed that the subject is facing the front, and the moving direction of the detected subject is the optical axis direction. Further, in the case that the vertical length of the aspect ratio of the detection range of the entire subject is short and the horizontal length of the aspect ratio is long, and the position of the local detection area is in the upper right of the range of the entire detected subject, it is assumed that the moving direction of the detected subject is the right direction. As described above, it is possible to calculate the moving direction of the detected subject on the basis of the aspect ratio of the range of the entire detected subject, and the positional relationship between the range of the detected subject and the local detection area.

Even by using the above method, in the case that the moving direction of the detected subject changes suddenly (for example, in the case that the detected subject suddenly moves upward from a state where it is approaching the optical axis direction, such as a jump movement), there is a possibility that it is not possible to calculate the moving direction of the detected subject by the above method. In that case, it is necessary to estimate the moving direction of the detected subject before the detected subject changes the moving direction.

The method of using the posture detection result of the subject as an estimating method, which estimates the moving direction of the detected subject, will be described. Although there are various kinds of methods for posture detection of the subject, in the first embodiment, at first, joint regions of the subject are estimated from the image and by using a deep-learned neural network. By connecting those estimated joints, the posture information of the subject is detected. The moving direction of each subject may be learned in advance, or the moving direction may be estimated from a moving amount of each joint between frames. Further, a characteristic previous motion before the moving direction changes (for example, a motion before jumping) may be learned in advance. Furthermore, the moving direction may be estimated in combination with the local detection within the subject (for example, face, eye, etc.). In the case that the subject is only a person, the moving direction is estimated from the posture information obtained by detecting the joint regions of arms and legs before jumping. For example, it is estimated that the moving direction changes (for example, a posture before jumping) due to the arm being lowered or both legs being bent. Even in the case that the subject is not only a person (for example, in the case that a motorcycle is also included), the moving direction of the detected subject is estimated from a positional relationship of the joint regions of arms and legs of the person. In the case that a motorcycle is also included, as shown in FIG. 14D, in the case that the right leg is detected, the joints are bent, and the joint regions of waist and backbone are detected, it can be estimated that the detected subject is moving in the optical axis direction and in the right direction. Further, in the case that a motorcycle is also included, even by detecting the tilt of the tire or the handle, it is possible to estimate the moving direction of the detected subject.

To estimate whether or not the detected subject is moving in the optical axis direction, the subject position may be estimated from the defocus amount and detected.

In S6002, the CPU 121 performs a future prediction of the moving direction of the subject (a prediction of a future moving direction of the subject). Specifically, the CPU 121 predicts the moving direction of the subject based on a time-series change in a calculation result of the moving direction of the subject in the past frame. The future moving direction of the subject may be estimated based on time-series change amounts between frames in the aspect ratio of the detection range of the entire subject (hereinafter, also simply referred to as "an aspect ratio") and in the positional relationship between the detection range of the entire subject and the local detection area (hereinafter, also simply referred to as "a positional relationship of the subject area"). Here, the case that a motorcycle and a driver are the subjects will be described as an example. In the case that the aspect ratio changes from a state, in which the vertical length is long, to a state, in which the horizontal length is long, and the positional relationship changes so that the local detection area is in the upper right with respect to the detection range of the entire subject, since the moving direction changes to the right direction from approaching toward the optical axis direction, it can be estimated that the moving direction changes to the right direction. In this example, the local detection area is the driver's helmet.

Further, in the case of performing the prediction of the moving direction of the subject by posture estimation of the subject, for example, the motion before jumping is estimated from the posture information of the joint regions of the arms and legs of the person who is the subject and a time-series change in the joint regions, and when the moving direction of the detected subject changes upward, it is possible to predict the moving direction of the subject.

Figure 18A:
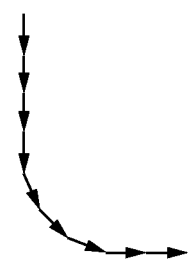
FIG. 18A, FIG. 18B, FIG. 18C, FIG. 18D, FIG. 18E, and FIG. 18F are diagrams for explaining focus movable ranges in the first embodiment.
Figure 18B:
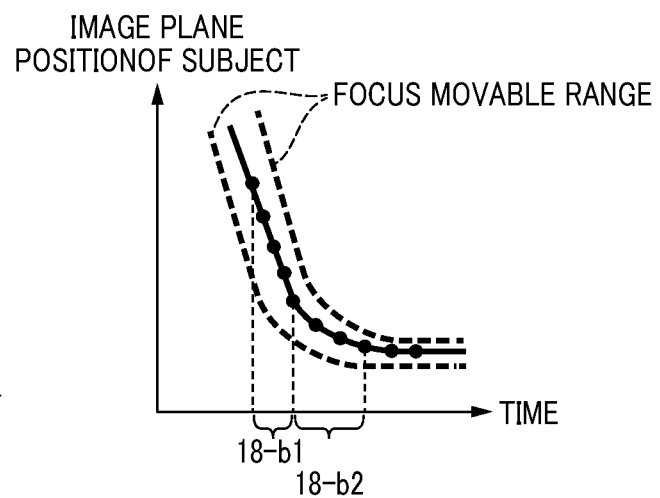
Figures 18C, 18D:
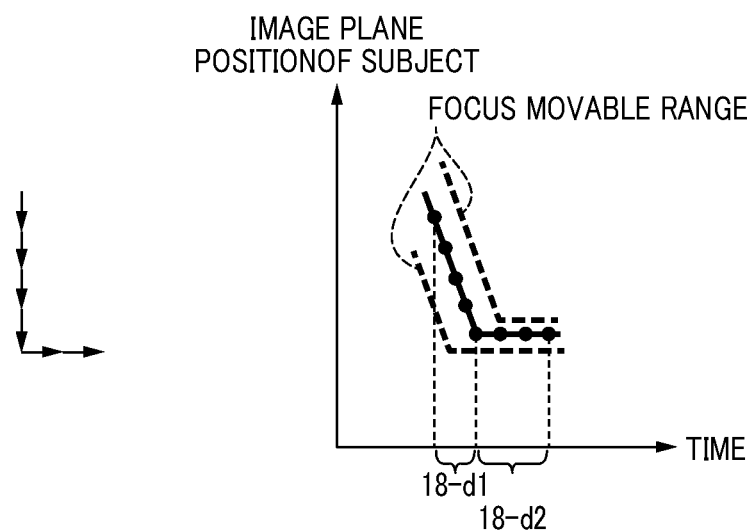

As described above, in S6002, the CPU 121 performs the prediction of the future moving direction of the detected subject based on the time-series change in the moving direction calculation result of the detected subject obtained in the past plurality of frames. The prediction of the future moving direction of the detected subject will be described with reference to FIG. 18A, FIG. 18B, FIG. 18C, FIG. 18D, FIG. 18E, and FIG. 18F. FIG. 18A is a diagram that shows the moving direction of the detected subject by arrows. The downward direction is the optical axis direction, and the right side is the right direction. As shown in FIG. 18A, in the case that the moving direction of the detected subject gradually changes, the moving direction is calculated on the basis of the aspect ratio of the range of the entire detected subject and the positional relationship with the local area, and the next moving direction of the detected subject is predicted from a change in the moving direction in time series. As shown in FIG. 18C, in the case that the moving direction of the detected subject changes suddenly, by the posture estimation of the subject described above, the posture of the subject before the moving direction suddenly changes is detected, and the next moving direction of the detected subject is predicted.

In S6003, the CPU 121 determines whether or not an image plane speed of the subject is high. The image plane speed of the subject is calculated based on a time-series change in an image plane position of the subject. In S6003, in the case that the CPU 121 determines that the image plane speed of the subject is high, the CPU 121 advances the processing to S6004. On the other hand, in S6003, in the case that the CPU 121 determines that the image plane speed of the subject is not high, the CPU 121 advances the processing to S6012. In S6004, the CPU 121 determines whether or not there is a change in the moving direction of the subject, in the case of determining that there is a change in the moving direction of the subject, the CPU 121 advances the processing to S6005, and in the case of determining that there is no change in the moving direction of the subject, the CPU 121 advances the processing to S6008.

Figure 17:
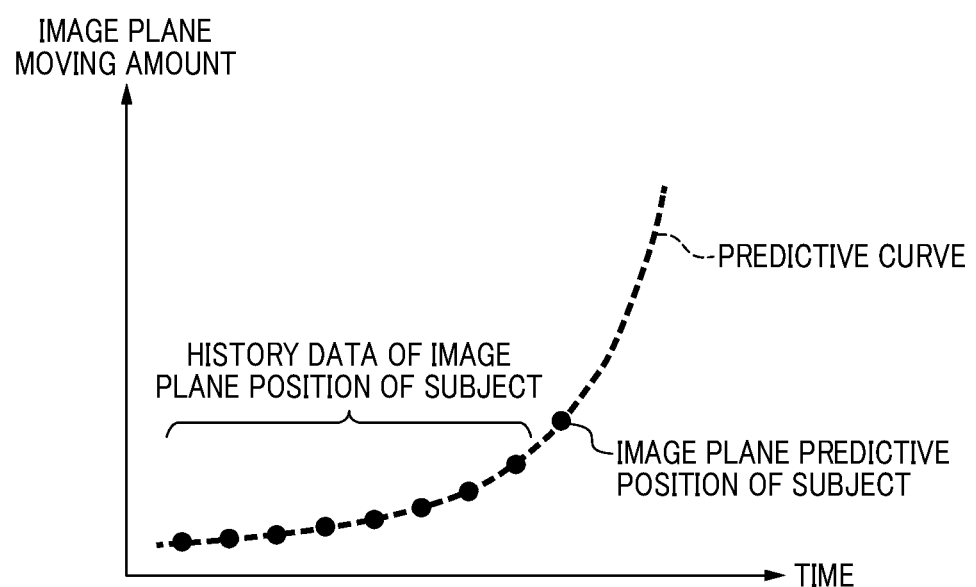
FIG. 17 is a diagram for explaining an image plane moving amount of a subject and a predictive curve in the first embodiment.

In S6005, the CPU 121 changes the number of history data used in a predictive calculation, which functions as a subject position prediction condition. The number of the history data used in the predictive calculation is the number of history data of the focus detection result (the defocus amount) and the focus detection time. Specifically, the CPU 121 changes the number of the history data used for subject position data calculated from the defocus amount and a focus position of past frames, which is used when predicting the subject position. FIG. 17 shows an example of the time-series change in the image plane position of the subject. In FIG. 17, a horizontal axis indicates a time, a vertical axis indicates an image plane moving amount of the subject, black circles indicate the history data of the image plane position of the subject based on the result of focus detection, and a dotted line shows a predictive curve obtained by a prediction processing. The history data is information about a position of the subject on an image plane (the image plane position of the subject) and its time, which is obtained in the past. This will be described with reference to the conceptual diagrams of FIG. 18A, FIG. 18B, FIG. 18C, FIG. 18D, FIG. 18E, and FIG. 18F. FIG. 18A is the diagram that shows the moving direction of the subject by arrows. FIG. 18B corresponds to FIG. 18A. In FIG. 18B, a horizontal axis indicates the time, a vertical axis indicates the image plane position of the subject, a solid line indicates a track of the subject, black circles indicate the image plane position of the subject at a timing of focus detection, and a dotted line indicates a focus movable range. FIG. 18A assumes that the photographer is photographing with the camera from the lower side and the vertical direction corresponds to the optical axis direction, and FIG. 18 shows the moving direction of the subject, which is estimated by the calculation of the moving direction of the subject performed in S6001 described above and the prediction of the future moving direction of the subject performed in S6002 described above. FIG. 18A is the diagram that shows an example, in which the moving direction of the subject approaches the optical axis direction and the moving direction changes to the right side in the middle of approaching the optical axis direction. In FIG. 18B, 18-b1 indicates a time range, in which the moving direction is the optical axis direction, and 18-b2 indicates a time range of the moving direction including the right direction. As shown in FIG. 18B, in the time range of 18-b1, since the moving direction does not change and an image plane speed change is not large, the CPU 121 does not change the number of the history data used in the predictive calculation. On the other hand, in the time range of 18-b2, since the moving direction changes and the image plane speed change is also occurring, by reducing the number of the history data to be used, in which the moving direction is the optical axis direction, the number of the history data used in the predictive calculation is reduced, and as a result, an error in the predictive calculation described later is reduced.

FIG. 18C and FIG. 18D show an example, in which the moving direction of the subject is different from the optical axis direction. FIG. 18C is the diagram that shows the example, in which the moving direction of the subject suddenly changes from the optical axis direction to the right direction. FIG. 18D corresponds to FIG. 18C. In FIG. 18D, a horizontal axis indicates the time, a vertical axis indicates the image plane position of the subject, 18-d1 indicates a time range, in which the moving direction of the subject is the optical axis direction, and 18-d2 indicates a time range, in which the moving direction of the subject is the right direction. In the example shown in FIG. 18C and FIG. 18D, in the case that the thing that the moving direction of the subject suddenly changes is estimated by the prediction of the future moving direction of the subject and the moving direction of the subject changes only from the optical axis direction to the right direction, the number of the history data used in the predictive calculation immediately before the moving direction of the subject changes is reset. That is, the number of the history data used in the predictive calculation immediately before the moving direction of the subject changes is not used. As a result, even in the case that the moving direction of the subject suddenly changes to the right direction, it is possible to suppress an erroneous prediction that the moving direction of the subject is the optical axis direction.

Figure 18E:
Figure 18F:
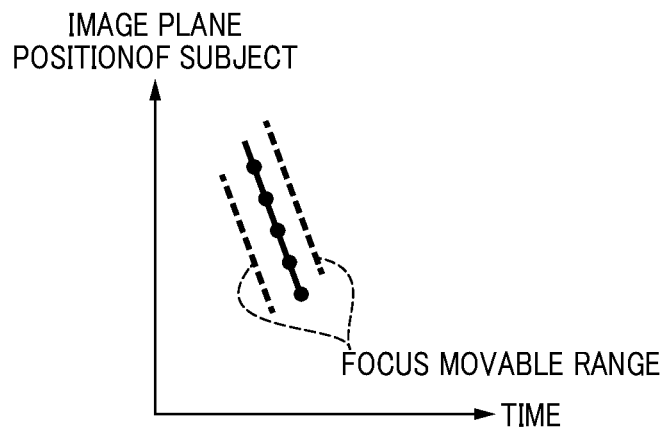

Further, FIG. 18E and FIG. 18F show an example, in which the change in the moving direction of the subject is different. FIG. 18E is the diagram that shows the example, in which the moving direction of the subject alternately repeats the optical axis direction and the right direction, and the optical axis direction and the left direction. FIG. 18F corresponds to FIG. 18E. In FIG. 18F, a horizontal axis indicates the time, and a vertical axis indicates the image plane position of the subject. In the example shown in FIG. 18E and FIG. 18F, although the moving direction of the subject is changing, since the image plane speed of the subject has not changed, the CPU 121 does not change the number of the history data used in the predictive calculation. As described above, by changing the number of the history data used in the predictive calculation according to the moving direction of the subject, it is possible to reduce the prediction error of the image plane position of the subject.

Figure 19:
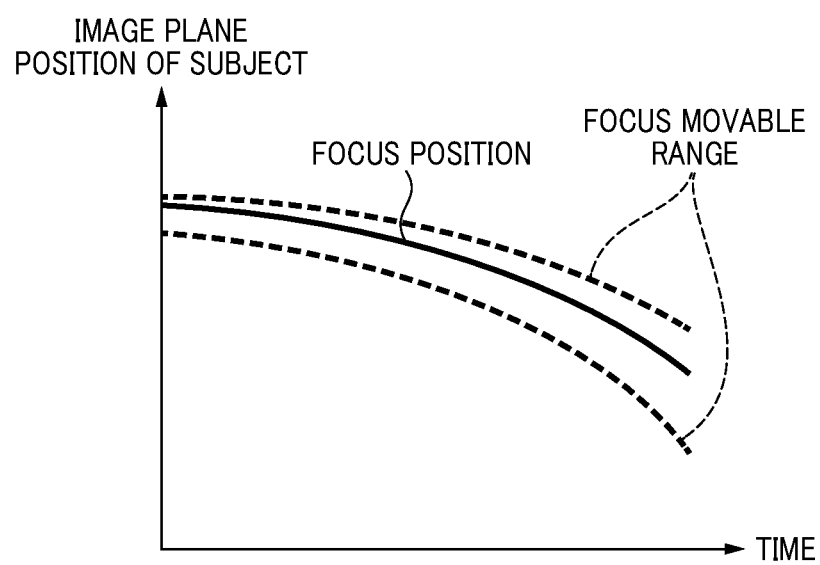
FIG. 19 is a diagram for explaining the focus movable range in the first embodiment.

In S6006, the CPU 121 sets the focus movable range. The focus movable range will be described with reference to FIG. 19. In FIG. 19, a horizontal axis indicates the time, a vertical axis indicates the image plane position of the subject, a solid line indicates the focus position, and a dotted line indicates the focus movable range. In the case that the subject is a moving object, due to the photographer accidentally removing an AF frame from the subject, there is a possibility that the inside of the AF frame becomes the background. In such a case, it takes time to return the focus to the subject. In the first embodiment, the CPU 121 estimates a range, in which the subject moves, from an image plane moving speed of the subject, the subject distance, etc., and sets the focus movable range based on the estimated range, in which the subject moves. As a result, it is possible to prevent the subject from being out of focus even when the subject becomes out of the focus movable range.

As a result, even in the case that the inside of the AF frame erroneously becomes the background due to framing, etc., it is possible to suppress a phenomenon of suddenly becoming out-of-focus with respect to the subject. In the first embodiment, the focus movable range has been described, and further, as described above, when the subject becomes out of the focus movable range, the focus does not move, that is, a focus stop time may be changed.

The moving direction of the subject and setting of the focus movable range will be described with reference to FIG. 18A, FIG. 18B, FIG. 18C, FIG. 18D, FIG. 18E, and FIG. 18F. In FIG. 18B, in the case that the moving direction of the subject changes from the optical axis direction to the right direction, since the subject does not move in the optical axis direction, the CPU 121 sets the focus movable range to be smaller than when the subject moves in the optical axis direction. Further, in FIG. 18D, in the case that the moving direction of the subject changes from the optical axis direction to the right direction, or immediately before the moving direction of the subject changes from the optical axis direction to the right direction, the CPU 121 sets the focus movable range to be smaller than when the subject moves in the optical axis direction.

In S6007, the CPU 121 changes the focus detection area. Specifically, the CPU 121 changes the focus detection area so as to widen the focus detection area or move the center of gravity of the focus detection area in the moving direction with respect to a moving direction other than the optical axis direction of the subject by the prediction of the future moving direction of the subject performed in S6002 described above. As a result, even in the case that the moving direction of the subject changes, it is possible to prevent the subject from being out of the focus detection area.

In S6008, the CPU 121 calculates an image plane predictive position of the subject. Specifically, the CPU 121 performs the prediction of the image plane position of the subject by performing multivariate analysis (for example, least squares method), which uses the past history data of the image plane position and time of the subject, and obtaining an equation of the predictive curve. Further, the CPU 121 calculates the image plane predictive position of the subject by substituting a still image photographing time into the obtained equation of the predictive curve.

In S6009, the CPU 121 changes a focus moving speed (a focus image plane moving speed). Specifically, at first, the CPU 121 estimates the image plane moving speed of the subject (a moving speed of the subject) on the basis of the prediction result of the future moving direction of the subject obtained in S6002, the image plane predictive position of the subject (the image plane position of the subject that is predicted) obtained in S6008, and the history data. Next, the CPU 121 changes the focus image plane moving speed according to the image plane moving speed of the subject that is estimated. In the above-mentioned example shown in FIG. 18A and FIG. 18B, since the CPU 121 estimates that the image plane moving speed of the subject is decreasing, the CPU 121 changes the focus image plane moving speed by reducing the focus image plane moving speed. Further, in the above-mentioned example shown in FIG. 18C and FIG. 18D, since the CPU 121 determines that the moving direction of the subject has changed suddenly, and the moving direction of the subject does not move in the optical axis direction, the CPU 121 changes the focus image plane moving speed by setting the focus image plane moving speed to 0. As described above, in S6009, the CPU 121 changes the focus image plane moving speed by setting the focus image plane moving speed according to the moving direction of the subject and the moving speed of the subject.

In S6010, the CPU 121 determines whether or not the subject is within the focus movable range that is set in S6006, and in the case of determining that the subject is within the focus movable range, the CPU 121 advances the processing to S6011. On the other hand, in S6010, in the case of determining that the subject is not within the focus movable range (that is, the subject is out of the focus movable range), the CPU 121 does not move the focus, and ends the predictive AF processing. In S6011, the CPU 121 moves the focus to the image plane position corresponding to the subject position predicted (the image plane predictive position of the subject), i.e., moves the focus lens 105 to the image plane predictive position of the subject, and ends the predictive AF processing. In S6012, the CPU 121 moves the focus to the image plane position corresponding to the subject position, which is calculated based on the focus detection result (the defocus amount), (the image plane position of the subject), i.e., moves the focus lens 105 to the image plane position of the subject, and ends the predictive AF processing.

FIG. 20 shows items to be changed at the time of the predictive calculation and at the time of focus control according to the moving direction of the subject described in the first embodiment. At the time of the predictive calculation and at the time of the focus control, the CPU 121 changes the items such as "the number of the history data used in the predictive calculation", "the focus movable range", "the focus moving speed", and "the focus detection area", which are shown in FIG. 20, according to the moving direction of the subject. That is, "the focus movable range", "the focus moving speed", and "the focus detection area" are used as a focus control condition when performing the focus control. The focus control condition includes at least one of "the focus movable range", "the focus moving speed", and "the focus detection area". Further, "the number of the history data used in the predictive calculation (the number of the history data of the focus detection result and the focus detection time)" is used as the subject position prediction condition when performing the predictive calculation. The focus movable range is a movable range of the focus lens of the image pickup optical system. Further, the focus moving speed is a moving speed of the focus lens of the image pickup optical system. Values of these items shown in FIG. 20 are stored in the ROM of the CPU 121 within the image pickup apparatus (the camera 100) as a table corresponding to a change in the moving direction of the detected subject. The CPU 121 changes the values of these items by referring to the table corresponding to the change in the moving direction of the detected subject, which is stored in the ROM.

In the present invention, the moving direction of the detected subject is estimated by using the size of the detected subject area, the positional relationship of the subject area, and the aspect ratio. Further, in the present invention, a future change of the moving direction of the detected subject is predicted by using the information of the size of the subject area, the positional relationship of the subject area, the aspect ratio, and the moving direction of the detected subject, which change in time series. By means of these technical configurations of the present invention, it is possible to obtain a more accurate photographing result with a less time lag from the focus detection timing to the image exposure timing as compared with the case that the same thing is performed by using the focus detection result.

For example, in the case of trying to estimate that the subject approaches and then moves away by using only the focus detection result (the defocus amount), it is difficult to estimate that once the subject stops, whether it stops as it is or reverses and moves away. However, in the present invention, since a plurality of patterns are distinguished by using the pattern of the subject as the photographing scene characteristic, and not only the moving direction of the detected subject is estimated, but also the future prediction of the moving direction of the detected subject is performed, it is possible to obtain the photographing result that the time lag is less and the accuracy is higher. For example, the plurality of patterns is a pattern of "a coming motorcycle", a pattern of "a sideways motorcycle", and a pattern of "a moving-away motorcycle".

As described above, although the first embodiment has a configuration, in which in the case that the focus area is detected, as the focus detection area for preferentially performing the focus detection with respect to the subject detection area, the focus area is selected, in the present invention, the method of setting the focus detection area is not limited to this.

For example, as the method of setting the focus detection area, the CPU 121 may be provided with a mode, in which the subject detection area is prioritized (a second mode), and a mode, in which the focus area is prioritized (a first mode), as modes that can be set by the photographer. Specifically, in the first mode, both the subject detection area (the first local area) and the focus area (the second local area) can be selected as the focus detection area, and the focus area is preferentially set as the focus detection area. In the second mode, the subject detection area (the first local area) is set as the focus detection area. In this way, by providing the CPU 121, which functions as the local area selecting unit, with the second mode, in which the subject detection area is prioritized, and the first mode, in which the focus area is prioritized, it is possible to easily reflect the photographer's intention regarding the area desired to be focused on the subject.

Further, as described above, in the first embodiment, the configuration that realizes the detection of the focus area by means of the area detection based on the machine learning (the focus area detecting unit 142 that is configured by the deep-learned CNN (the learned CNN) and performs the detection of the focus area) has been described. However, in the present invention, the detection of the focus area may be realized by using a method other than the learned CNN.

For example, in the present invention, it is possible to set the focus area by using information such as the aspect ratio of the subject detection area, the size of the subject detection area, and depth information of the subject using the defocus map (hereinafter, referred to as "subject detection information"). In the case that the subject is a person, when the size of the subject detection area is equal to or larger than the predetermined size, it is possible to estimate the position of the eyelashes with respect to the pupil area detected as the subject detection area, and set the area of the estimated eyelashes as the focus area. In the case that the subject is a motorcycle, it is possible to detect the tilt direction of the motorcycle body by using the defocus map, and switch between setting the focus area on the head and setting the focus area on an area that is estimated to be the body position of the subject detection area corresponding to the entire motorcycle. Similarly, as the subject detection area, it is also possible to determine far and near of the distance of the subject by using defocus information of the motorcycle body and defocus information of the helmet (the head). Further, a configuration, in which the aspect ratio of the subject detection area is used to determine whether the body of a vehicle such as a motorcycle or a car is detected from the front side or the body of the vehicle such as the motorcycle or the car is detected from the side face, and the focus area is set, may be adopted.

As described above, by using the configuration, in which the focus area is set by using the subject detection information, it is not necessary to prepare a circuit for performing the focus area detection by the CNN within the image pickup apparatus, i.e., it is not necessary to prepare the focus area detection CNN within the image pickup apparatus, and the focus area detection can be realized at low cost.

Next, a second embodiment of the present invention will be described with reference to FIG. 21, FIG. 22A, FIG. 22B, FIG. 23A, FIG. 23B, FIG. 23C, and FIG. 23D. The configuration of the second embodiment is the same as the configuration of the first embodiment, but only a focus detection area setting processing performed in the second embodiment is different from the focus detection area setting processing performed in S4000 to S4002 of the first embodiment. In the focus detection area setting processing performed in the second embodiment, the focus detection area is selected from a focus detection candidate area within the detected subject.

Figure 21:
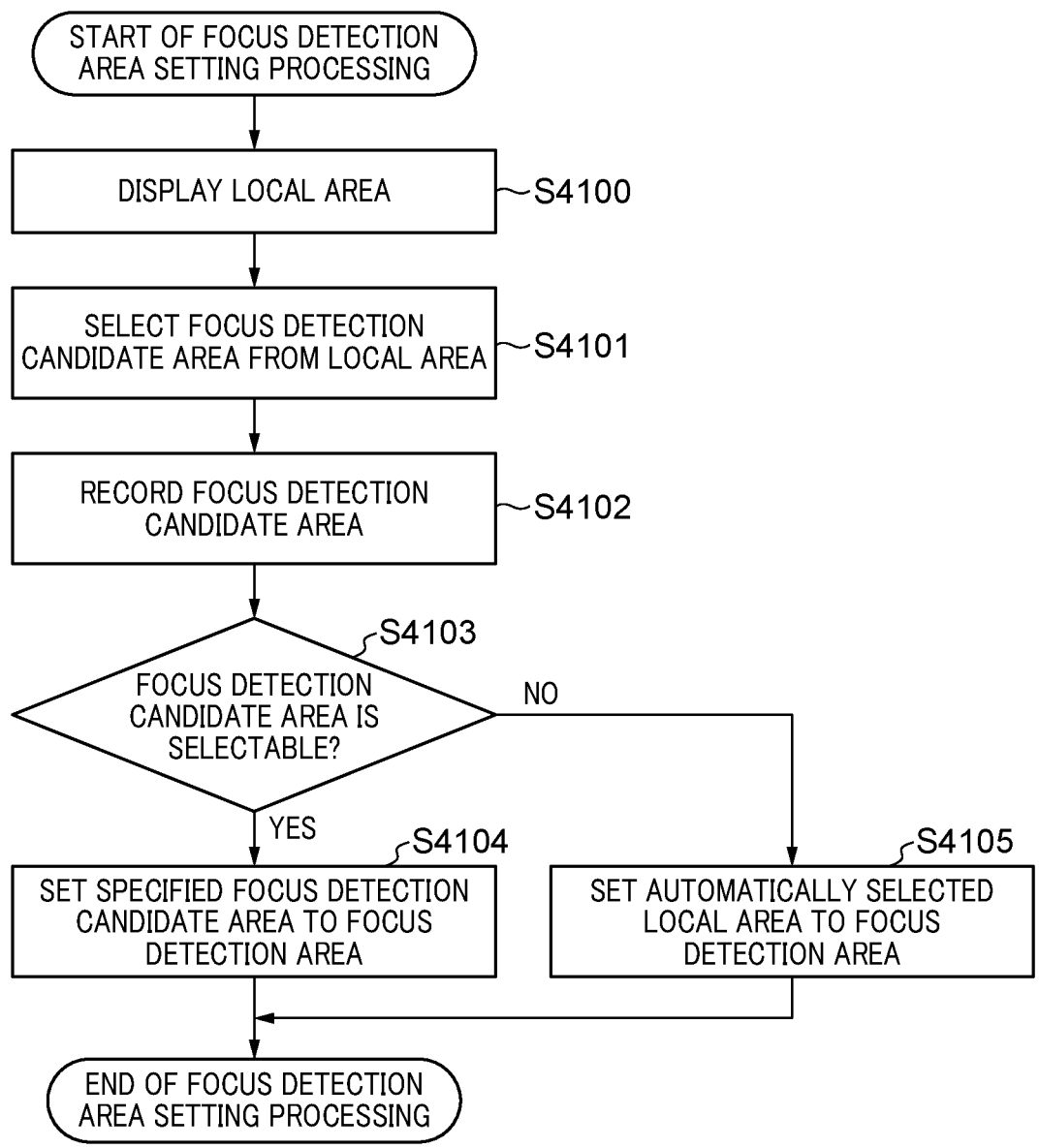
FIG. 21 is a flowchart that shows a flow of a focus detection area setting processing according to a second embodiment of the present invention.

Hereinafter, the description of the configuration of the second embodiment, which is the same as the configuration of the first embodiment, will be omitted. FIG. 21 is a flowchart that shows a flow of the focus detection area setting processing according to the second embodiment of the present invention.

Figure 22A:
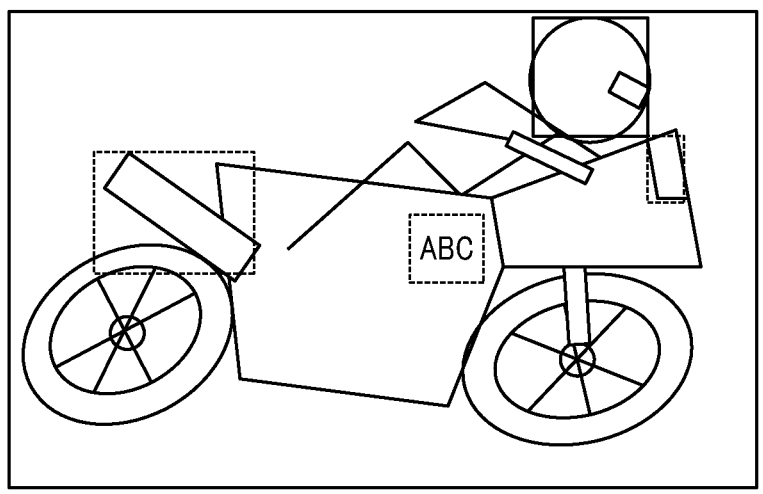
FIG. 22A and FIG. 22B are conceptual diagrams for explaining local areas and focus detection candidate areas in the second embodiment.
Figure 22B:
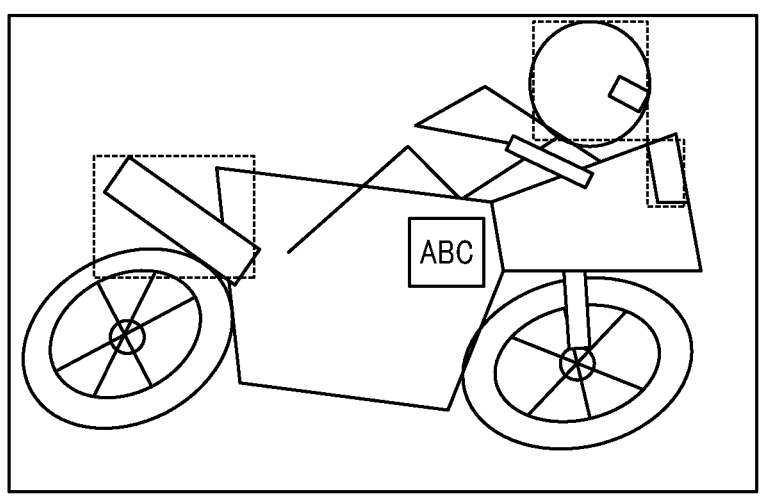

In S4100, the CPU 121 performs displaying of the local areas (also including the focus area) from the entire subject, which is detected with respect to the obtained image (the entire detected subject). FIG. 22A and FIG. 22B show examples, in which a motorcycle is detected as a detected subject. In FIG. 22A and FIG. 22B, an area surrounded by a dotted line indicates an area that becomes a focus detection candidate of the detected subject, and an area surrounded by a solid line indicates the focus detection candidate area. Further, in FIG. 22A and FIG. 22B, a helmet area, headlight part areas, a body logo part area, and muffler areas, which are surrounded by the dotted lines, are the areas that become the focus detection candidates of the detected subject.

In S4101, the CPU 121, which functions as a specifying unit, performs selecting (specifying) of the focus detection candidate area from the local areas (also including the focus area) of the detected subject. The user performs specifying of the focus detection candidate area from the local areas (also including the focus area) shown in FIG. 22A and FIG. 22B. The method of specifying the focus detection candidate area is a method of changing and selecting the focus detection candidate area by a touch operation or a button operation performed by the user's finger. The focus detection candidate area may be selected by the user's line of sight. Further, the focus detection candidate area may be changed not only in a state that the Sw1 is turned on, but also before becoming the state that the Sw1 is turned on, or during continuous photographing in a state that the Sw2 is turned on. Further, such a method may be adopted, that is, there is no prior displaying of the local areas that is performed in S4100, and after a specified position is determined by the touch operation or the button operation performed by the user's finger, the local area close to the specified position is selected on the camera 100 side, and the selected local area is set as the focus detection candidate area.

Figure 23A:
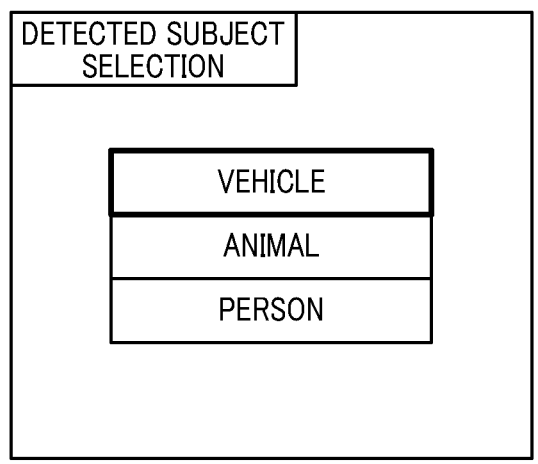
FIG. 23A, FIG. 23B, FIG. 23C, and FIG. 23D are conceptual diagrams for explaining setting of the focus detection candidate area in the second embodiment.
Figure 23B:
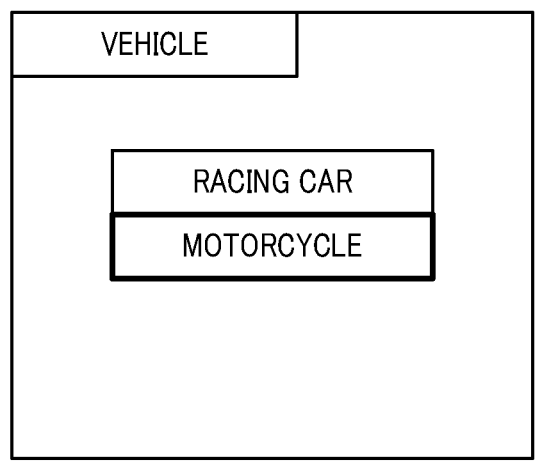
Figure 23C:
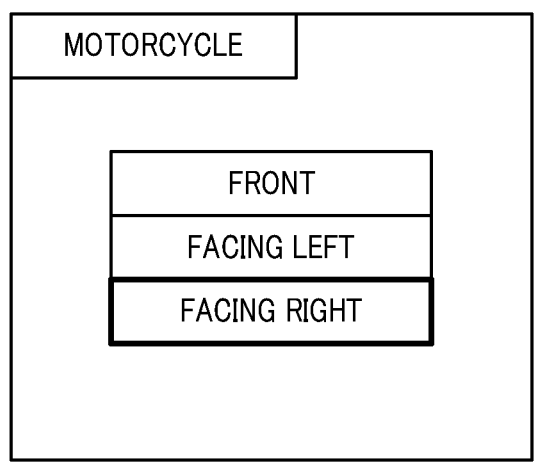
Figure 23D:
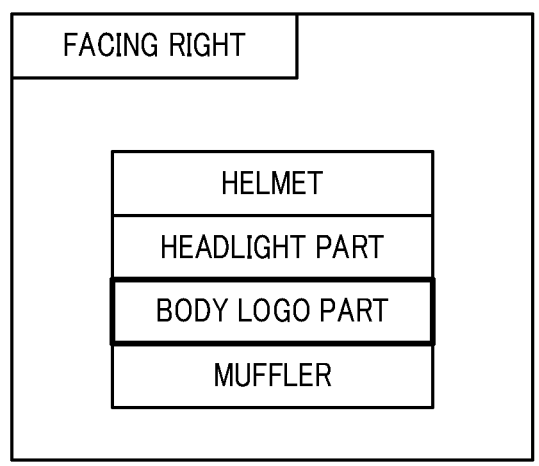

As another method, a method of selecting (specifying) the focus detection candidate area from a menu operation within the camera 100 will be described with reference to FIG. 23A, FIG. 23B, FIG. 23C, and FIG. 23D. FIG. 23A shows a setting screen for detected subject selection. In FIG. 23A, the detected subject is selected from detectable subjects (for example, "vehicle", "animal", "person") (in the example of FIG. 23A, "vehicle" is selected as the detected subject). In FIG. 23B, the type of "vehicle" is further selected from "vehicle" being the detected subject that is selected (in the example of FIG. 23B, as the type of "vehicle", "motorcycle" is selected). In FIG. 23C, the orientation of "motorcycle", which is the detected subject of the selected type, is specified (in the example of FIG. 23C, "facing right" is selected). In FIG. 23D, the focus detection candidate area within the detected subject of the selected type is selected (in the example of FIG. 23D, "body logo part" is selected as the focus detection candidate area). In FIG. 23C and FIG. 23D, different focus detection candidate areas may be selected from the local areas (also including the focus area) with respect to the orientation of the detected subject. As described above, the focus detection candidate area may be selected by the menu operation. Further, an illustrative image of each detected subject may be selected, and the local area that becomes the focus detection candidate area may be displayed and selected. Furthermore, such a method may be adopted, that is, a 3D model of each detected subject is displayed as the illustrative image, the 3D model can be rotated by the user's operation, and different focus detection candidate areas can be specified according to the orientation and the posture of the detected subject.

Depending on the orientation of the detected subject, items that become candidates of the local areas (also including the focus area) may be changed. For example, in the case that "front" is selected as the orientation of "motorcycle" in FIG. 23C, only "helmet" and "headlight part" are displayed as the focus detection candidate area, and on the other hand, in the case that "facing right" is selected as the orientation of "motorcycle" in FIG. 23C, as shown in FIG. 23D, "helmet", "headlight part", "body logo part", and "muffler" may be displayed as the focus detection candidate area.

Further, depending on the orientation of the detected subject, the items that become candidates of the local areas (also including the focus area) may be set by the user.

In S4102, the CPU 121 records the focus detection candidate area that is specified in S4101 by the specifying unit. With respect to recording, a positional relationship on the screen of the focus detection candidate area specified from the local areas (also including the focus area) and a positional relationship in the optical axis direction from the defocus amount of each local area (also including the focus area) may be stored in the memory within the CPU 121.

In S4103, the CPU 121 determines whether or not the focus detection candidate area that is specified in S4101 by the specifying unit is selectable, and in the case of determining that the focus detection candidate area is selectable, the CPU 121 advances the processing to S4104. On the other hand, in S4103, in the case of determining that the focus detection candidate area is not selectable, or in the case of not selecting the focus detection candidate area, the CPU 121 advances the processing to S4105. Hereinafter, a determination condition, which is necessary for the CPU 121 to determine whether or not the focus detection candidate area is selectable, is simply referred to as "a determination condition". The determination condition includes a case that the specified focus detection candidate area becomes invisible due to the moving direction or a posture change of the detected subject and cannot be detected and a case, in which the specified focus detection candidate area can be detected, but the posture of the subject is changing at a timing different from the timing specified by the user. The case whether or not the posture of the subject is changing may be determined by comparing a matching level with the result of the posture and the moving direction of the subject and the positional relationship with each local area at the time of recording in S4102. Specifically, it is assumed that the screen is an XY direction, the optical axis direction is a Z direction, and a vector is an XYZ direction, a correlation between the magnitude and orientation of the vector in the XYZ direction at the time of recording is determined, in the case that there is a correlation, it is determined that the posture has not changed, and in the case that there is no correlation, it is determined that the posture has changed. The correlation method is a method of calculating an inner product of the vectors and obtaining each angle of the two vectors. In the case that each angle is less than a predetermined value, it is determined that there is a correlation, and in the case that each angle is equal to or more than the predetermined value, it is determined that there is no correlation. As described with reference to FIG. 23A, FIG. 23B, FIG. 23C, and FIG. 23D, in the case that the focus detection candidate area corresponding to the orientation of the detected subject is selected, it is determined that the focus detection candidate area is selectable. On the other hand, in the case that the focus detection candidate area corresponding to the orientation of the detected subject is not selected, in the case that the focus detection candidate area cannot be seen, or in the case that the focus detection candidate area is not detected as the focus area according to the photographing scene, it is determined that the focus detection candidate area is not selectable.

In S4104, the CPU 121 sets the focus detection candidate area specified by the specifying unit as the focus detection area. When the setting of the focus detection area performed in S4104 is completed, the CPU 121 ends the focus detection area setting processing, and advances the processing to S405 of FIG. 10. In S4105, the CPU 121 sets the local area automatically selected by the camera 100 as the focus detection area instead of the focus detection candidate area specified by the specifying unit. When the setting of the focus detection area performed in S4105 is completed, the CPU 121 ends the focus detection area setting processing, and advances the processing to S405 of FIG. 10. As the method of automatically selecting a local area by the camera 100, for example, the nearest local area of each local area or a local area having priority in advance with respect to the shape, the posture and the moving direction of the subject may be selected.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-028816, filed Feb. 25, 2021, which is hereby incorporated by reference herein in its entirety.

What is claimed is:

1. An image pickup apparatus comprising:
   an image pickup unit configured to pick up a subject image formed by an image pickup optical system and generate image data; and
   at least one processor and/or circuit configured to function as following units;
   a subject detecting unit configured to detect a subject included in the image data generated by the image pickup unit and obtain a subject detection result;
   a focus detection unit configured to obtain a focus detection result of a focus detection area, which is set based on the subject detection result;
   an obtaining unit configured to obtain, from a plurality of pieces of the image data, respective moving directions of the subject detected, and
   a control unit configured to perform a predictive calculation, which predicts a position of the subject detected by the subject detecting unit at a time after a predetermined period of time has elapsed from a focus detection time, and perform focus control of the image pickup optical system, and wherein the control unit changes at least one of a subject position prediction condition and a focus control condition according to a time-series change in the moving directions of the subject obtained from the plurality of pieces of the image data by the obtaining unit and a time-series change in the focus detection result obtained by the focus detection unit.

2. An image pickup apparatus comprising:

an image pickup unit configured to pick up a subject image formed by an image pickup optical system and generate image data; and at least one processor and/or circuit configured to function as following units:

a subject detecting unit configured to detect a subject included in the image data generated by the image pickup unit and obtain a subject detection result;

a focus detection unit configured to obtain a focus detection result of a focus detection area, which is set based on the subject detection result; and a control unit configured to perform a predictive calculation, which predicts a position of the subject detected by the subject detecting unit at a time after a predetermined period of time has elapsed from a focus detection time, and perform focus control of the image pickup optical system, wherein the control unit changes at least one of a subject position prediction condition and a focus control condition according to time-series changes in the subject detection result obtained by the subject detecting unit and the focus detection result obtained by the focus detection unit, and wherein the subject position prediction condition is the number of history data of the focus detection result and the focus detection time.

3. The image pickup apparatus according to claim 2, wherein in a case that the control unit determines that there is a change in a moving direction of the subject based on the subject detection result, the control unit reduces the number of the history data.

4. An image pickup apparatus comprising:

an image pickup unit configured to pick up a subject image formed by an image pickup optical system and generate image data; and at least one processor and/or circuit configured to function as following units:

a subject detecting unit configured to detect a subject included in the image data generated by the image pickup unit and obtain a subject detection result;

a focus detection unit configured to obtain a focus detection result of a focus detection area, which is set based on the subject detection result; and a control unit configured to perform a predictive calculation, which predicts a position of the subject detected by the subject detecting unit at a time after a predetermined period of time has elapsed from a focus detection time, and perform focus control of the image pickup optical system, wherein the control unit changes at least one of a subject position prediction condition and a focus control condition according to time-series changes in the subject detection result obtained by the subject detecting unit and the focus detection result obtained by the focus detection unit, and wherein the focus control condition includes at least one of a moving speed of a focus lens of the image pickup optical system, a movable range of the focus lens, and the focus detection area.

5. The image pickup apparatus according to claim 4, wherein in a case that the control unit determines that there is a change in a moving direction of the subject based on the subject detection result, the control unit sets the movable range small.

6. The image pickup apparatus according to claim 4, wherein the control unit changes the moving speed of the focus lens according to a moving speed of the subject.

7. The image pickup apparatus according to claim 4, wherein in a case that the control unit determines that there is a change in a moving direction of the subject based on the subject detection result, the control unit widens the focus detection area or moves the center of gravity of the focus detection area in the moving direction.

8. The image pickup apparatus according to claim 1, wherein the focus control condition includes at least one of a moving speed of a focus lens of the image pickup optical system, a movable range of the focus lens, and the focus detection area, and in a case that the control unit determines that there is a change in a moving direction of the subject based on the time-series change in the moving directions of the subject obtained from the plurality of pieces of the image data, the control unit sets the movable range small.

9. The image pickup apparatus according to claim 1, wherein the focus control condition includes at least one of a moving speed of a focus lens of the image pickup optical system, a movable range of the focus lens, and the focus detection area, and the control unit changes the moving speed of the focus lens according to a moving speed of the subject.

10. A control method for an image pickup apparatus, comprising:

an image pickup step of causing an image pickup unit of the image pickup apparatus to pick up a subject image formed by an image pickup optical system and generating image data;

a subject detecting step of detecting a subject included in the image data generated in the image pickup step and obtaining a subject detection result;

a focus detection step of obtaining a focus detection result of a focus detection area, which is set based on the subject detection result;

an obtaining step of obtaining, from a plurality of pieces of the image data, respective moving directions of the subject detected, and a control step of performing a predictive calculation, which predicts a position of the subject detected in the subject detecting step at a time after a predetermined period of time has elapsed from a focus detection time, and performing focus control of the image pickup optical system, and wherein in the control step, according to a time-series change in the moving directions of the subject obtained from the plurality of pieces of the image data in the obtaining step and a time-series change in the focus detection result obtained in the focus detection step, at least one of a subject position prediction condition and a focus control condition is changed.

11. A non-transitory computer-readable storage medium storing a program for causing a computer to execute a control method for an image pickup apparatus, comprising:

an image pickup step of causing an image pickup unit of the image pickup apparatus to pick up a subject image formed by an image pickup optical system and generating image data;

a subject detecting step of detecting a subject included in the image data generated in the image pickup step and obtaining a subject detection result;

a focus detection step of obtaining a focus detection result of a focus detection area, which is set based on the subject detection result;

an obtaining step of obtaining, from a plurality of pieces of the image data, respective moving directions of the subject detected, and a control step of performing a predictive calculation, which predicts a position of the subject detected in the subject detecting step at a time after a predetermined period of time has elapsed from a focus detection time, and performing focus control of the image pickup optical system, and wherein in the control step, according to a time-series change in the moving directions of the subject obtained from the plurality of pieces of the image data in the obtaining step and a time-series change in the focus detection result obtained in the focus detection step, at least one of a subject position prediction condition and a focus control condition is changed.

* * * * *